(12) United States Patent
Kim

(10) Patent No.: US 11,355,214 B2
(45) Date of Patent: Jun. 7, 2022

(54) DEBUGGING MEMORY DEVICES

(71) Applicant: Micron Technology, Inc., Boise, ID (US)

(72) Inventor: Junam Kim, Seoul (KR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/989,704

(22) Filed: Aug. 10, 2020

(65) Prior Publication Data

US 2022/0044752 A1 Feb. 10, 2022

(51) Int. Cl.
*G11C 29/04* (2006.01)
*G11C 29/42* (2006.01)
*G11C 29/44* (2006.01)
*G11C 7/04* (2006.01)
*G06F 9/48* (2006.01)
*G11C 29/02* (2006.01)

(52) U.S. Cl.
CPC ............ *G11C 29/42* (2013.01); *G06F 9/4812* (2013.01); *G11C 7/04* (2013.01); *G11C 29/021* (2013.01); *G11C 29/44* (2013.01); *G11C 2029/4402* (2013.01)

(58) Field of Classification Search
CPC ........ G11C 29/42; G11C 29/021; G11C 29/44; G11C 7/04; G06F 9/4812
See application file for complete search history.

(56) References Cited

U.S. PATENT DOCUMENTS

| | | | | |
|---|---|---|---|---|
| 6,336,174 B1 * | 1/2002 | Li | ................ | G06F 11/1441 365/228 |
| 6,693,840 B2 * | 2/2004 | Shimada | ................ | G11C 14/00 365/228 |
| 8,510,628 B2 * | 8/2013 | Bedeschi | ............ | G06F 11/1048 714/763 |
| 2013/0086309 A1 * | 4/2013 | Lee | ................ | G06F 3/0659 711/103 |

\* cited by examiner

*Primary Examiner* — Mohammed A Bashar
(74) *Attorney, Agent, or Firm* — Holland & Hart LLP

(57) ABSTRACT

Methods, systems, and devices for debugging memory devices are described. A memory system may be an example of a multichip package (MCP) that includes at least one volatile memory device and at least one non-volatile memory device. In some examples, errors may occur at the volatile memory device, and data associated with the errors may be stored to the non-volatile memory device. To store the data, access operations being performed on the non-volatile memory may be interrupted (e.g., paused) and the data may be stored to the non-volatile memory before the access operations are resumed. The stored data may be accessed (e.g., by a host device) for use during an error correction operation.

25 Claims, 10 Drawing Sheets

DEBUGGING MEMORY DEVICES

BACKGROUND

The following relates generally to one or more systems for memory and more specifically to debugging memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not- or (NOR), and not- and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
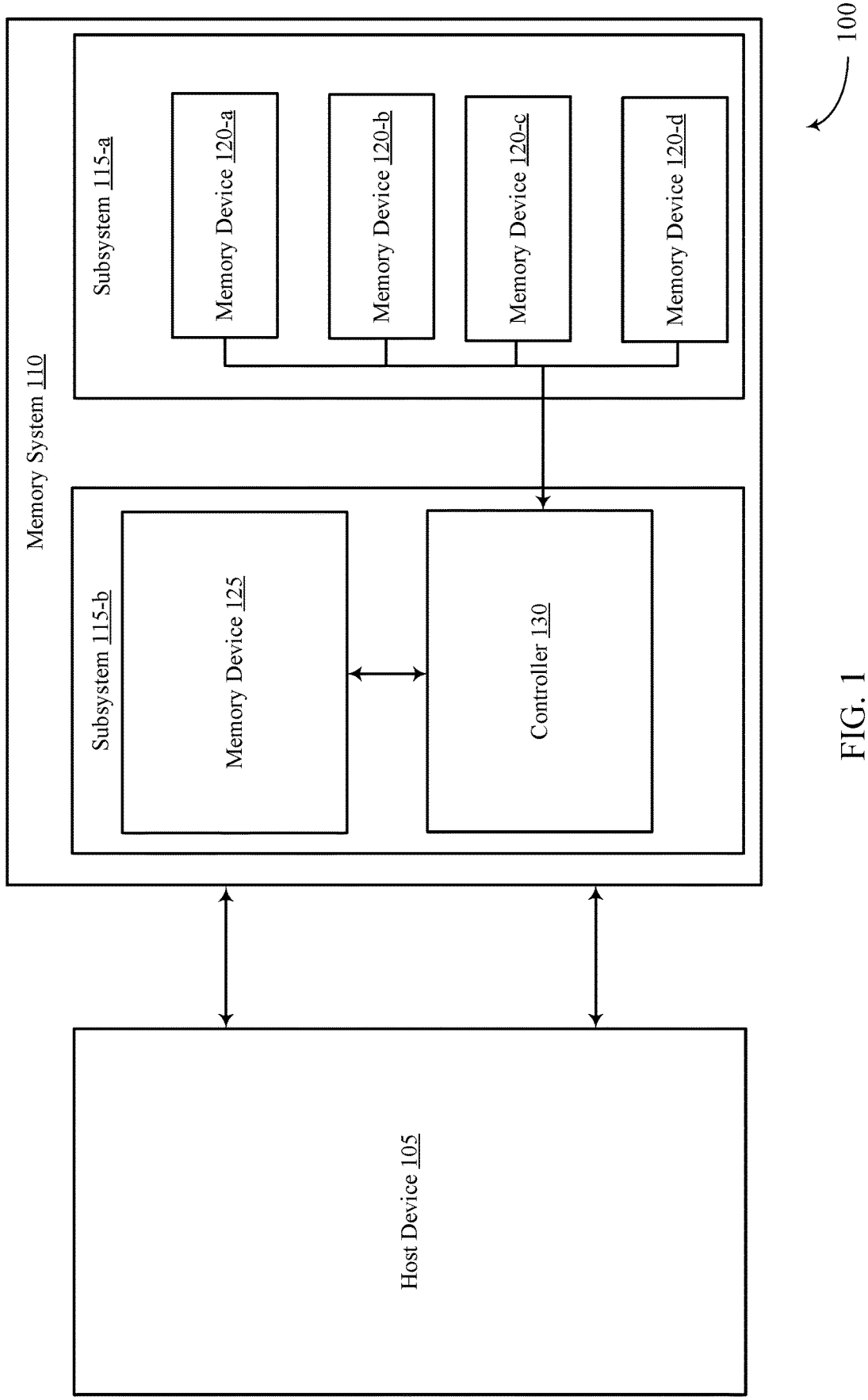
FIG. 1 illustrates an example of a system that supports debugging memory devices in accordance with examples as disclosed herein.

A memory system may be or include a multichip package (MCP), where a single package includes multiple memory dice, which may be referred to as chips. Each die may include one or more memory devices. For example, a memory device may include two or more memory arrays, where a memory array as used herein may include a respective type of memory (e.g., volatile or non-volatile memory). A memory device may also include an interface for communicating with a host device and may, in some cases, communicate with the host device independently of other memory devices associated with the memory system. As used herein, the term interface may refer to a bus (or buses) and/or a set of pins that is specific to a type of memory device (e.g., specific to a volatile or non-volatile memory device).

Where a memory system includes multiple memory devices, the memory devices may exchange information with the host device via separate logical interfaces, which may be implemented using separate physical interfaces (e.g., separate signal paths). In some cases, a host device may be configured to communicate with one type of memory device (e.g., a non-volatile memory device), yet errors may occur at another type of memory device (e.g., a volatile memory device) of the MCP. In some cases, the errors may result in a system error (e.g., non-recoverable error, memory fault, or other condition requiring a restart or reboot of the memory system). Thus, the root cause of the errors may be challenging to determine because conditions occurring at the volatile memory device prior to or at the time of the error may be unknown.

As described herein, a memory system may be configured to store data associated with errors that occur at volatile memory devices to non-volatile memory. In some examples, the memory system may include a MCP that is configured to communicate with a host device. The host device may communicate with a controller of the MCP to initiate access commands (e.g., read commands, write commands) on the memory devices. In some examples, the host device may communicate with the controller to initiate various access commands on the non-volatile memory. While the access commands are being processed by the controller, one or more error or warning conditions may occur at the volatile memory. In such instances, the volatile memory may communicate signaling to the controller to interrupt (e.g., pause) operations associated with the access commands. Additionally or alternatively, when processing of the access commands is interrupted, the volatile memory may communicate data associated with the errors that occurred for storage at the non-volatile memory. The data may be stored such that, during an error correction operation, the host device may access the data and correct (e.g., debug) the errors. Thus utilizing the non-volatile memory to store error-related information associated with volatile memory may allow for a host device to determine and correct errors that occur on various memory devices of a MCP that include different memory interfaces.

Features of the disclosure are initially described in the context of a system, volatile memory device, and non-volatile memory device as described with reference to FIGS. 1 through 3. Features of the disclosure are described in the context of memory systems and process flow diagrams as described with reference to FIGS. 4-8. These and other features of the disclosure are further illustrated by and described with reference to an apparatus diagram and flowcharts that relate to debugging memory devices as described with reference to FIGS. 9 and 10.

FIG. 1 is an example of a system 100 that supports debugging memory devices in accordance with examples as disclosed herein. The system 100 includes a host device 105 coupled with a memory system 110. In some examples, the memory system 110 may include a memory subsystem 115-a that includes one or more memory devices 120 and a memory subsystem 115-*b* that includes one or more memory devices 125 and a controller 130 (e.g., a controller memory system controller 130). The controller 130 may be configured to communicate with the memory devices 120, the memory devices 125, and the host device 105.

A memory system 110 may be an example of a MCP that includes different types of memory devices. For example, the memory system 110 may be or include any device or collection of devices, where the device or collection of devices includes at least two memory arrays. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The memory system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host device 105, which may be coupled with the memory system 110. In some examples, the host device 105 may include one or more devices, and in some cases may include a processor chipset and a software stack executed by the processor chipset. For example, the host device 105 may include an application configured for communicating with the memory system 110 or a device therein. The processor chipset may include one or more cores, one or more caches (e.g., memory local to or included in the host device 105), a memory controller (e.g., NVDIMM controller), and a storage protocol controller (e.g., PCIe controller, SATA controller). The host device 105 may use the memory system 110, for example, to write data to the memory system 110 and read data from the memory system 110. Although one memory system 110 is shown in FIG. 1, it is to be understood that the host device 105 may be coupled with any quantity of memory systems 110.

The host device 105 may be coupled with the memory system 110 via at least one physical host interface. The host device 105 and the memory system 110 may in some cases be configured to communicate via a physical host interface using an associated protocol (e.g., to exchange or otherwise communicate control, address, data, and other signals between the memory system 110 and the host device 105). Examples of a physical host interface may include, but are not limited to, a serial advanced technology attachment (SATA) interface, a UFS interface, an eMMC interface, a peripheral component interconnect express (PCIe) interface, USB interface, Fiber Channel, Small Computer System Interface (SCSI), Serial Attached SCSI (SAS), Double Data Rate (DDR), a dual in-line memory module (DIMM) interface (e.g., DIMM socket interface that supports DDR), Open NAND Flash Interface (ONFI), Low Power Double Data Rate (LPDDR). In some examples, the host device 105 may be coupled with the memory system 110 (e.g., the host device controller 106 may be coupled with the memory system controller 115) via a respective physical host interface for each memory subsystem 115 included in the memory system 110, or via a respective physical host interface for each type of memory device included in a respective memory subsystem 115.

The memory system 110 may include a memory subsystem 115-*a* (e.g., a first memory subsystem 115-*a*) and a memory subsystem 115-*b* (e.g., a second memory subsystem 115-*b*). The memory subsystem 115-*a* may include one or more memory devices 120, and each of the memory devices 120 may include one or more memory arrays of a first type of memory cells (e.g., volatile memory cells). Additionally or alternatively, the memory subsystem 115-*b* may include one or more memory devices 125, and each of the memory devices 125 may include one or more memory arrays of a second type of memory cells (e.g., non-volatile memory cells). Although a finite quantity of memory devices (e.g., memory devices 120, memory device 125) are shown in the example of FIG. 1, it is to be understood that memory system 110 may include any quantity of memory devices 120 and memory devices 125.

In some examples, the memory system 110 may include a controller 130, such as a memory system controller 130. The memory system controller 130 may be coupled with and communicate with the host device 105 (e.g., via the physical host interface), and may be an example of a control component configured to cause the memory system 110 to perform various operations in accordance with examples as described herein. The memory system controller 130 may also be coupled with and communicate with memory devices 120 (e.g., the memory devices 120 of the memory subsystem 115-*a*) or the memory device 125 to perform operations such as reading data, writing data, erasing data, or refreshing data at a memory device 120 or a memory device 125, and other such operations, which may generically be referred to as access operations. In some cases, the memory system controller 130 may receive commands from the host device 105 and communicate with one or more memory devices 120 or memory devices 125 to execute such commands (e.g., at memory arrays within the one or more memory devices 120 or memory devices 125). For example, the memory system controller 130 may receive commands or operations from the host device 105 and may convert the commands or operations into instructions or appropriate commands to achieve the desired access of the memory devices 120 or memory devices 125. And in some cases, the memory system controller 130 may exchange data with the host device 105 and with one or more memory devices 120 or memory devices 125 (e.g., in response to or otherwise in association with commands from the host device 105). For example, the memory system controller 130 may convert responses (e.g., data packets or other signals) associated with the memory devices 120 or memory devices 125 into corresponding signals for the host device 105.

The memory system controller 130 may be configured for other operations associated with the memory devices 120 or memory devices 125. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host device 105 and physical addresses (e.g., physical block addresses) associated with memory cells within the memory devices 120 or memory devices 125.

The memory system controller 130 may include hardware such as one or more integrated circuits or discrete components, a buffer memory, or a combination thereof. The hardware may include circuitry with dedicated (e.g., hardcoded) logic to perform the operations ascribed herein to the memory system controller 130. The memory system controller 130 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 130 may also include a local memory (not shown). In some cases, the local memory may include read-only memory (ROM) or other memory that may store operating code (e.g., executable instructions) executable by the memory system controller 130 to perform functions ascribed herein to the memory system controller 130. In some cases, the local memory may additionally or alternatively include static random access memory (SRAM) or other memory that may be used by the memory system controller 130 for internal storage or calculations, for example, related to the functions ascribed herein to the memory system controller 130. Additionally or alternatively, the local memory may serve as a cache for the memory system controller 130. For example, data may be stored to the local memory when read from or written to a memory device 120 or memory device 125, and may be available within the local memory for subsequent retrieval for or manipulation (e.g., updating) by the host device 105 (e.g., with reduced latency relative to a memory device 120 or memory device 125) in accordance with a cache policy.

In some examples, the memory subsystem 115-a may include one or more memory devices 120, such as memory device 120-a, memory device 120-b, memory device 120-c, and memory device 120-d. Each of the memory devices 120 may include one or more arrays of volatile memory cells. For example, a memory device 120 may include random access memory (RAM) memory cells, such as dynamic RAM (DRAM) memory cells and synchronous DRAM (SDRAM) memory cells. In some examples, a memory device 120 may support random access operations (e.g., by the host device 105) with reduced latency relative to a memory device 125, or may offer one or more other performance differences relative to a memory device 125. Although FIG. 1 illustrates the memory subsystem 115-a including four memory devices 120, the memory subsystem 115-a may include any quantity of memory devices 120. For example, the memory subsystem 115-a may include eight (8) DRAM memory devices.

The memory subsystem 115-a may include a device memory controller (not shown) and one or more memory devices 120 to support a desired capacity or a specified capacity for data storage. Each memory device 120 may include a local memory controller (not shown) and a memory array. A memory array may be a collection (e.g., one or more grids, one or more banks, one or more tiles, one or more sections) of memory cells, with each memory cell being operable to store at least one bit of data.

In some examples, the memory device 125 may include one or more arrays of non-volatile memory cells. For example, a memory device 125 may include NAND (e.g., NAND flash) memory, ROM, phase change memory (PCM), self-selecting memory, other chalcogenide-based memories, ferroelectric RAM (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), and electrically erasable programmable ROM (EEPROM).

In some examples, a memory device 125 include (e.g., on a same die or within a same package) a local controller (not shown) which may execute operations on one or more memory cells of the memory device 125. A local controller may operate in conjunction with a memory system controller 130 or may perform one or more functions ascribed herein to the memory system controller 130. In some cases, a memory device 125 that includes a local controller may be referred to as a managed memory device and may include a memory array and related circuitry combined with a local (e.g., on-die or in-package) controller. An example of a managed memory device is a managed NAND (MNAND) device.

In some cases, the memory device 125 may be or include a NAND device (e.g., NAND flash device). For example, in some cases, the memory device 125 may be a package that includes one or more dies. A die may, in some examples, be a piece of electronics-grade semiconductor cut from a wafer (e.g., a silicon die cut from a silicon wafer). Each die may include one or more planes, and each plane may include a respective set of blocks, where each block may include a respective set of pages, and each page may include a set of memory cells.

In some cases, a NAND memory device 125 may include memory cells configured to each store one bit of information, which may be referred to as single level cells (SLCs). Additionally or alternatively, a NAND memory device 125 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

As described herein, the memory system 110 may be an example of a MCP that includes different types of memory devices. For example, the memory system 110 may include memory devices 120, which may include volatile memory cells, and memory device 125, which may include non-volatile memory cells. Each of the memory devices may include a different type of memory interface, and the host device 105 may be configured to communicate with one of the interfaces (e.g., the interface associated with the memory device 125).

In some examples, error or warning conditions may occur when operating the memory devices 120. Because the memory devices 120 may not include non-volatile storage (e.g., the memory devices 120 may include only volatile storage), it may be desirable to store data associated with the error or warning conditions to the memory device 125 (e.g., to a non-volatile storage device). By storing data associated with error or warning conditions that occur at the memory devices 120 to the memory device 125, the host device 105 may be able to access the data (e.g., the error-related data stored at the memory device 125) and may be able to determine the cause of and correct the errors or warning conditions. For example, the data may indicate a cause of the error or information related to the error, which may be used by the host device 105 during an error correction operation to fix the error(s) at the memory devices 120. Thus utilizing the memory device 125 to store error-related information of the memory devices 120 may allow for a host device 105 to determine and correct errors that occur on various memory devices of a MCP (e.g., of the memory system 110) that include different memory interfaces.

Figure 2:
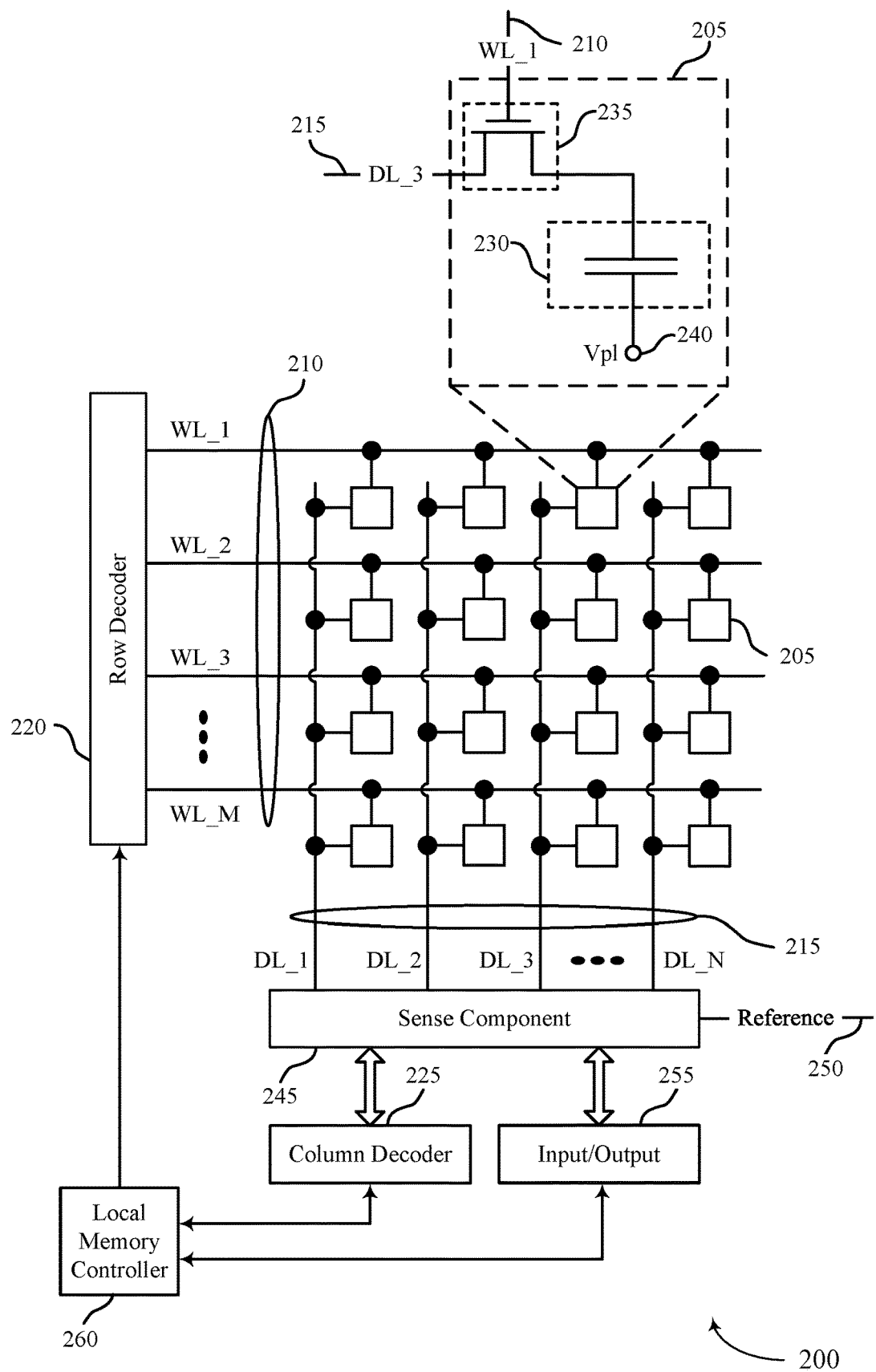
FIG. 2 illustrates an example of a volatile memory device that supports debugging memory devices in accordance with examples as disclosed herein.

FIG. 2 illustrates an example of a memory device 200 that supports debugging memory devices in accordance with examples as disclosed herein. The memory device 200 may be an example of a memory die located within a memory device 120 as described with reference to FIG. 1. In some examples, the memory device 200 may be referred to as a memory chip, a memory device, or an electronic memory apparatus. The memory device 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array located within a memory device 120 as described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory device 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory device 200.

The local memory controller 260 may control the accessing of memory cells 205 through the various components (e.g., row decoder 220, column decoder 225, sense component 245). The local memory controller 260 may communicate with the memory system controller 130 as described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., a memory system controller 130 associated with a host device 105, another controller associated with the memory device 200), translate the commands or the data (or both) into information that can be used by the memory device 200, perform one or more operations on the memory device 200, and communicate data from the memory device 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory device 200. In general, the amplitude, the shape, or the duration of an applied voltage or current discussed herein may be varied and may be different for the various operations discussed in operating the memory device 200.

The local memory controller 260 may be operable to perform one or more access operations on one or more memory cells 205 of the memory device 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory device 200 that are not directly related to accessing the memory cells 205.

The memory device 200 may be an example of one or more memory devices 120 described with reference to FIG. 1. For example, the memory device 200 may be located on a MCP that includes different types of memory devices. As described herein, the MCP may include one or more nonvolatile memory devices, such as the memory device 125 as described with reference to FIG. 1. The memory device 200 may be associated with a memory interface that is different than the memory interfaces of other memory devices located on the MCP. Accordingly, when errors associated with the memory cells 205 occur, data may be stored to a non-volatile memory device for use by a host device (e.g., a host device 105 as described with reference to FIG. 1) in determining the cause of and correcting the error(s).

In some examples, errors may occur when operating the memory cells 205 as shown in FIG. 2. Because the memory device 200 may be associated with a specific type of memory interface, it may be desirable to store data associated with the errors to a non-volatile memory device (not shown). The data may be stored to the non-volatile memory device using one or more signal paths (not shown). Once stored to the non-volatile memory, a host device may be able to access the data and may be able to determine the cause of and correct the error(s). Thus utilizing a non-volatile memory device to store data associated with errors of the memory cells 205 may allow for a host device to determine and correct errors that occur on various memory devices of a MCP that include different memory interfaces.

Figure 3:
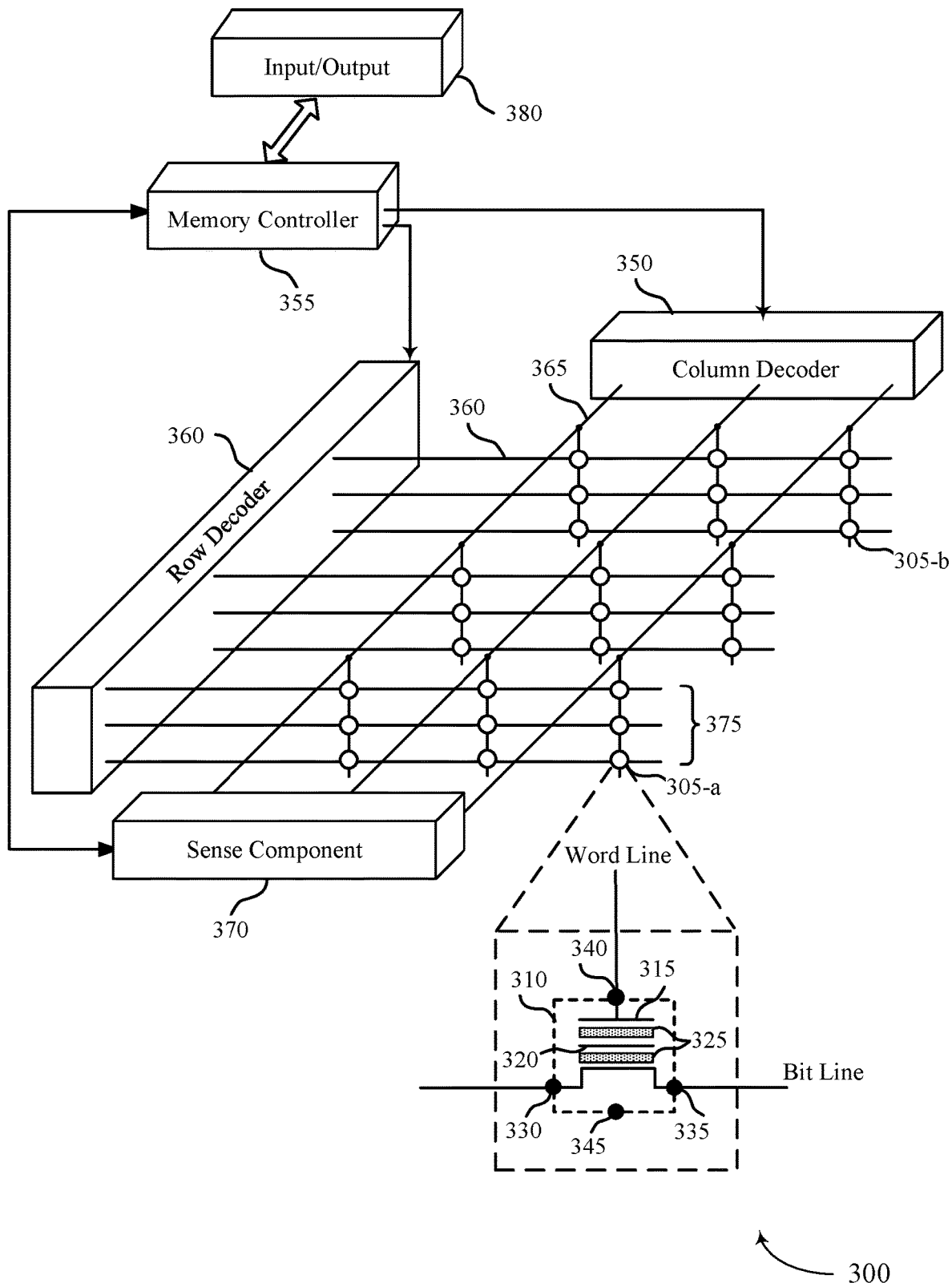
FIG. 3 illustrates an example of a non-volatile memory device that supports debugging memory devices in accordance with examples as disclosed herein.

FIG. 3 illustrates an example of a memory device 300 that supports debugging memory devices in accordance with examples as disclosed herein. In some cases, the memory device 300 may be an example of a memory device 125 as described with reference to FIG. 1. FIG. 3 is an illustrative representation of various components and features of the memory device 300. As such, it should be appreciated that the components and features of the memory device 300 are shown to illustrate functional interrelationships, and not necessarily actual physical positions within the memory device 300. Further, although some elements included in FIG. 3 are labeled with a numeric indicator, some other corresponding elements are not labeled, even though they are the same or would be understood to be similar, in an effort to increase visibility and clarity of the depicted features.

The memory device 300 may include one or more memory cells, such as memory cell 305-*a* and memory cell 305-*b*. A memory cell 305 may be, for example, a flash or other type of NAND memory cell, such as in the blow-up diagram of memory cell 305-*a*.

Each memory cell 305 may be programmed to store a logic value representing one or more bits of information. In some cases, a single memory cell 305—such as an SLC memory cell 305—may be programmed to one of two supported states and thus may store one bit of information at a time (e.g., a logic 0 or a logic 1). In other cases, a single memory cell 305—such as an MLC, TLC, QLC, or other type of multiple-level memory cell 305—may be programmed to one of more than two supported states and thus may store more than one bit of information at a time. In some examples, a single MLC memory cell 205 may be programmed to one of four supported states and thus may store two bits of information at a time corresponding to one of four logic values (e.g., a logic 00, a logic 01, a logic 10, or a logic 11). In some examples, a single TLC memory cell 205 may be programmed to one of eight supported states and thus may store three bits of information at a time corresponding to one of eight logic values (e.g., 000, 001, 010, 011, 100, 101, 110, or 111). In some examples, a single QLC memory cell 305 may be programmed to one of sixteen supported states and thus may store four bits of information at a time corresponding to one of sixteen logic values (e.g., 0000, 0001, . . . 1111).

In some cases, a multiple-level memory cell 305 (e.g., an MLC memory cell, a TLC memory cell, a QLC memory cell) may be physically different than an SLC cell. For example, a multiple-level memory cell 305 may use a different cell geometry or may be fabricated using different materials. In some cases, a multiple-level memory cell 305 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays (e.g., flash arrays), each memory cell 305 may include a transistor that has a floating gate or a dielectric material for storing an amount of charge representative of the logic value. For example, the blow-up in FIG. 3 illustrates a NAND memory cell 305-*a* that includes a transistor 310 (e.g., a metal-oxide-semiconductor (MOS) transistor) that may be used to store a logic value. The transistor 310 has a control gate 315 and may also include a floating gate 320, where the floating gate 320 is sandwiched between two portions of dielectric material 325. Transistor 310 includes a first node 330 (e.g., a source or drain) and a second node 335 (e.g., a drain or source). A logic value may be stored in transistor 310 by placing (e.g., writing, storing) a quantity of electrons (e.g., an amount of charge) on floating gate 320. The amount of charge to be stored on the floating gate 320 may depend on the logic value to be stored. The charge stored on floating gate 320 may affect the threshold voltage of transistor 310, thereby affecting the amount of current that flows through transistor 310 when transistor 310 is activated (e.g., when a voltage is applied to the control gate 315).

A logic value stored in transistor 310 may be sensed (e.g., as part of a read operation) by applying a voltage to the control gate 315 (e.g., to control node 340, via the word line 360) to activate transistor 310 and measuring (e.g., detecting, sensing) the resulting amount of current that flows through the first node 330 or the second node 335 (e.g., via a digit line 365). For example, a sense component 370 may determine whether an SLC memory cell 305 stores a logic 0 or a logic 1 in a binary manner (e.g., based on a presence or absence of a current through the memory cell 305 when a read voltage is applied to the control gate 315, or based on whether the current is above or below a threshold current). For a multiple-level memory cell 305, a sense component 370 may determine a logic value stored in the memory cell 305 based on various intermediate threshold levels of current when a read voltage is applied to the control gate 315. In one example of a multiple-level architecture, a sense component 370 may determine the logic value of a TLC memory cell 305 based on eight different levels of current, or ranges of current, that define the eight potential logic values that could be stored by the TLC memory cell 305.

An SLC memory cell 305 may be written by applying one of two voltages (e.g., a voltage above a threshold or a voltage below a threshold) to memory cell 305 to store, or not store, an electric charge on the floating gate 320 and thereby cause the memory cell 305 store one of two possible logic values. For example, when a first voltage is applied to the control node 340 (e.g., via the word line 360) relative to a bulk node 345 for the transistor 310 (e.g., when the control node 340 is at a higher voltage than the bulk), electrons may tunnel into the floating gate 320. In some cases, the bulk node 345 may alternatively be referred to as a body node. Injection of electrons into the floating gate 320 may be referred to as programing the memory cell 305 and may occur as part of a program operation. A programmed memory cell may, in some cases, be considered as storing a logic 0. When a second voltage is applied to the control node 340 (e.g., via the word line 360) relative to the bulk node 345 for the transistor 310 (e.g., when the control node 340 is at a lower voltage than the bulk node 345), electrons may leave the floating gate 320. Removal of electrons from the floating gate 320 may be referred to as erasing the memory cell 305 and may occur as part of an erase operation. An erased memory cell may, in some cases, be considered as storing a logic 1. In some cases, memory cells 305 may be programmed at a page level of granularity due to memory cells 305 of a page sharing a common word line 360, and memory cells 305 may be erased at a block level of granularity due to memory cells 305 of a block sharing commonly biased bulk nodes 345.

In contrast to writing an SLC memory cell 305, writing a multiple-level (e.g., MLC, TLC, or QLC) memory cell 305 may involve applying different voltages to the memory cell 305 (e.g., to the control node 340 or bulk node 345 thereof) at a finer level of granularity to more finely control the amount of charge stored on the floating gate 320, thereby enabling a larger set of logic values to be represented. Thus, multiple-level memory cells 305 may provide greater density of storage relative to SLC memory cells 305 but may, in some cases, involve narrower read or write margins or greater complexities for supporting circuitry.

A charge-trapping NAND memory cell 305 may operate similarly to a floating-gate NAND memory cell 305 but, instead of or in addition to storing a charge on a floating gate 320, a charge-trapping NAND memory cell 305 may store a charge representing a logic state in a dielectric material below the control gate 315. Thus, a charge-trapping NAND memory cell 305 may or may not include a floating gate 320.

In some examples, each row of memory cells 305 may be connected to a corresponding word line 360, and each column of memory cells 305 may be connected to a corresponding digit line 365. Thus, one memory cell 305 may be located at the intersection of a word line 360 and a digit line 365. This intersection may be referred to as an address of a memory cell 305. Digit lines 365 may alternatively be referred to as bit lines. In some cases, word lines 360 and digit lines 365 may be substantially perpendicular to one another and may create an array of memory cells 305. In some cases, word lines 360 and digit lines 365 may be generically referred to as access lines or select lines.

Accessing memory cells 305 may be controlled through row decoder 360 and column decoder 350. For example, row decoder 360 may receive a row address from memory controller 355 and activate an appropriate word line 360 based on the received row address. Similarly, column decoder 350 may receive a column address from memory controller 355 and activate an appropriate digit line 365. Thus, by activating one word line 360 and one digit line 365, one memory cell 305 may be accessed.

Upon accessing, a memory cell 305 may be read, or sensed, by sense component 370. For example, sense component 370 may be configured to determine the stored logic value of memory cell 305 based on a signal generated by accessing memory cell 305. The signal may include a current, a voltage, or both a current and a voltage on the digit line 365 for the memory cell 305 and may depend on the logic value stored by the memory cell 305. The sense component 370 may include various transistors or amplifiers configured to detect and amplify a signal (e.g., a current or voltage) on a digit line 365. The logic value of memory cell 305 as detected by the sense component 370 may be output via input/output component 380. In some cases, sense component 370 may be a part of column decoder 350 or row decoder 360, or sense component 370 may otherwise be connected to or in electronic communication with column decoder 350 or row decoder 360.

A memory cell 305 may be programmed or written by activating the relevant word line 360 and digit line 365 to enable a logic value (e.g., representing one or more bits of information) to be stored in the memory cell 305. A column decoder 350 or a row decoder 360 may accept data, for example from input/output component 380, to be written to the memory cells 305. As previously discussed, in the case of NAND memory, such as flash memory used in some NAND and 3D NAND memory devices, a memory cell 305 may be written by storing electrons in a floating gate or an insulating layer.

A memory controller 355 may control the operation (e.g., read, write, re-write, refresh) of memory cells 305 through the various components, for example, row decoder 360, column decoder 350, and sense component 370. In some cases, one or more of row decoder 360, column decoder 350, and sense component 370 may be co-located with memory controller 355. A memory controller 355 may generate row and column address signals in order to activate the desired word line 360 and digit line 365. In some examples, a memory controller 355 may generate and control various voltages or currents used during the operation of memory device 300.

The memory device 300 may be an example of one or more memory devices 125 described with reference to FIG. 1. For example, the memory device 300 may be located on a MCP that includes different types of memory devices. As described herein, the MCP may include one or more volatile memory devices, such as the memory devices 120 as described with reference to FIG. 1. The memory device 300 may be associated with a memory interface that is different than the memory interfaces of other memory devices located on the MCP. Accordingly, when errors associated with memory cells of the volatile memory devices occur, data may be stored to one or more memory cells 305 for use by a host device (e.g., a host device 105 as described with reference to FIG. 1) in determining the cause of and correcting the error(s).

In some examples, errors may occur when operating volatile memory cells of the MCP. Because volatile memory cells may be associated with a specific type of memory interface, it may be desirable to store data associated with the errors to non-volatile memory cells, such as the memory cells 305. The data may be communicated to the memory cells 305 for storing via one or more signal paths (not shown). Once stored to the memory cells 305, a host device may be able to access the data and may be able to determine the cause of and correct the error(s). Thus utilizing a memory device such as the memory device 300 to store data associated with errors that occur at volatile memory cells may allow for a host device to determine and correct errors that occur on various memory devices of a MCP that include different memory interfaces.

Figure 4:
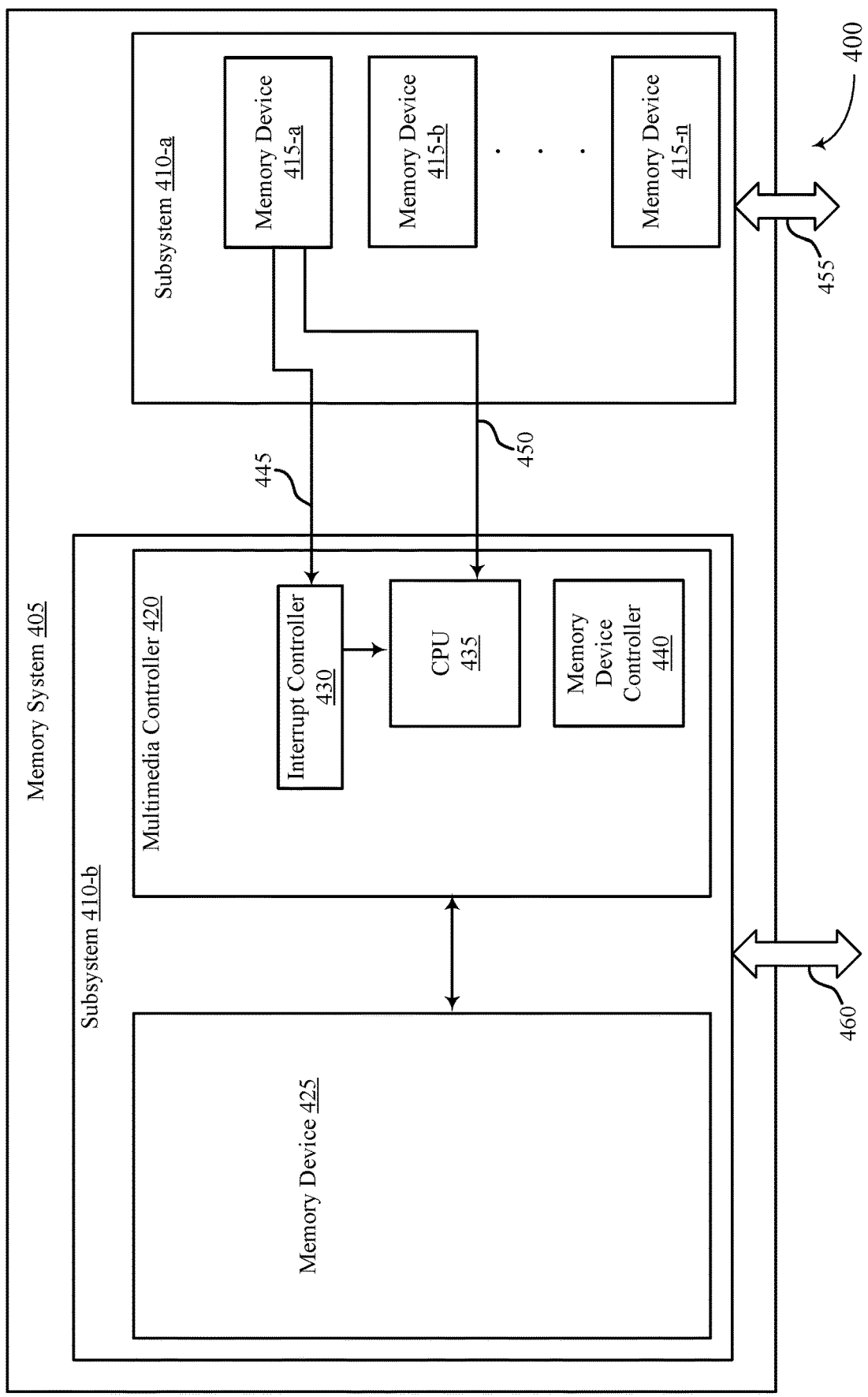
FIGS. 4-7 illustrate examples of memory systems that support debugging memory systems in accordance with examples as disclosed herein.

FIG. 4 illustrates an example diagram 400 of a memory system 405 that supports debugging memory devices in accordance with examples as disclosed herein. The memory system 405 may be an example of a memory system 110 as described with reference to FIG. 1. In some examples, the memory system 405 may be referred to as a memory package, a memory chip, a memory device, or an electronic memory apparatus. The memory system 405 may include one or more memory subsystems 410, such as a memory subsystem 410-a and a memory subsystem 410-b. The memory subsystem 410-a, which may be referred to as a first memory subsystem, may include one or more memory devices 415 that each include one or more memory cells.

The memory subsystem 410-*b*, which may be referred to as a second memory subsystem, may include a memory device 425, which may include one or more memory cells that are different than the memory cells of the memory devices 415. The memory subsystem 410-*b* may include a multimedia controller 420 that is configured to interface with the subsystem 410-*a* (e.g., one or more memory devices 415 of the subsystem 410-*a*) and may store data to the memory device 425. The stored data may be associated with errors that occur at the memory devices 415 and may be used to during an error correction operation. Additionally or alternatively, storing the data to the memory device 425 may allow for a host device to determine and correct errors that occur on various memory devices of the memory system 405 that include different memory interfaces.

The memory subsystem 410-*a* may include multiple memory devices 415-*a*. In some examples, the memory subsystem 410-*a* may include a first memory device 415-*a*, a second memory device 415-*b*, and an Nth memory device 415-*n* where N is any positive integer. Each of the memory devices 415 may include one or more memory cells, which may be referred to memory cells of a first type (e.g., a first type of memory cells). In some examples, the memory cells may be volatile memory cells. In some examples, the memory cells may be SRAM or DRAM memory cells. The memory subsystem 410-*a* may include a memory interface 455 (e.g., a first memory interface). In some examples, the memory subsystem 410-*a* may include multiple memory interfaces 455, where each memory interface 455 is coupled with one or a subset of the memory devices 415. For example, the memory subsystem 410-*a* may include multiple channels, where each channel includes a memory interface 455 for performing memory operations on one or more memory devices 415. In some examples, the memory device 415-*a* may include at least one pin coupled with a first signal path 445 and one or more additional pins coupled with a second signal path 450. Each of the signal paths may communicate data from the memory devices 415 of the subsystem 410-*a* to the subsystem 410-*b*. Although FIG. 1 illustrates only the memory device 415-*a* being coupled with the multimedia controller 420, any quantity of memory devices 415 may be coupled with the multimedia controller 420 and may communicate error-related data to be saved at the memory device 425.

The memory subsystem 410-*b* may include a multimedia controller 420 and a memory device 425. The multimedia controller 420, which may be referred to as an embedded multimedia controller (eMMC) or a universal flash storage (UFS) controller, may include an interrupt controller 430, a CPU 435, and/or a memory device controller 440. In some examples, the operations performed by the interrupt controller 430, the CPU 435, and the memory device controller 440 as described herein may be performed by a single component of the multimedia controller 420. For example, the operations may be performed by the CPU 435.

The memory subsystem 410-*b* may include a memory device 425 that includes one or more memory cells, which may be referred to memory cells of a second type (e.g., a second type of memory cells). In some examples, the memory cells of the memory device 425 may be a different type of memory cell than the memory cells of the first type (e.g., a different type of memory cell than the memory cells of the memory devices 415). In some examples, the memory cells may be non-volatile memory cells. In some examples, the memory cells may be flash memory cells (e.g., NAND memory cells). The multimedia controller 420 may include a memory interface 460 (e.g., a second memory interface) for memory access commands associated with the memory device 425. The second memory interface 460 may be a different type of interface than the first memory interface 455. In some examples, multimedia controller 420 may include at least one pin coupled with the first signal path 445 and one or more additional pins coupled with the second signal path 450. The pins coupled with the signal paths may be general purpose input/output (GPIO) pins and may be used to receive data from the memory devices 415. As discussed herein, the data may indicate errors that occur at the memory devices 415 and may be stored (e.g., saved) to the memory device 425.

In some examples, the multimedia controller 420 may perform access commands (e.g., read commands, write commands) on the memory device 425. The commands may be received, for example, via the interface 460 and may be stored in a queue for processing. The multimedia controller 420 (e.g., one or more components of the multimedia controller 420) may also save data associated with the subsystem 410-*a* to the memory device 425. For example, the multimedia controller 420 may receive, via the signal path 445 and/or the signal path 450, data relating to errors that occur at the memory device 415-*a*. In some examples, any access commands being performed on the memory device 425 may be paused (e.g., interrupted) before data associated with the memory device 415-*a* is written to the memory device 425.

To interrupt the access commands, a signal (e.g., a first signal, an interrupt signal) may be communicated from the memory device 415-*a* to the multimedia controller 420 via the signal path 445. In some examples, the signal may be received by the interrupt controller 430 and the interrupt controller 430 may communicate with the CPU 435 to interrupt any access operations being performed on the memory device 425. In other examples the signal may be received directly by the CPU 435 or any other component of the multimedia controller 420 configured to perform access commands on the memory device 425. By pausing any access commands being performed on the memory device 425, the multimedia controller 420 may receive and save data associated with any errors that occurred at the memory device 415-*a* (or any other memory device 415 of the subsystem 410-*a*). Additionally or alternatively, the data may be associated with one or more warning conditions associated with the memory device 415-*a*. For example, the warning condition may indicate that the temperature of the memory device 415-*a* has exceeded a threshold temperature value.

In some examples, the multimedia controller 420 may continue to receive access commands (e.g., from a host device) when access operations are interrupted. The multimedia controller 420 may include temporary storage (e.g., cache memory) configured to store received access commands until processing access commands resumes. In some examples, the multimedia controller 420 may resume processing access commands upon storing error-related data to the memory device 425, or upon receiving signaling from the subsystem 410-*a* (e.g., via the signal path 445 and/or the signal path 450).

When any access commands being performed on the memory device 425 are interrupted (e.g., paused), an additional signal or signals may be communicated from the memory device 415-*a* to the multimedia controller 420 via the signal path 450. In other examples, signals may be communicated from the memory device 415-*a* to the multimedia controller 420 via the signal path 450 at a same time (e.g., concurrently with) a signal is transmitted via signal path 445 to interrupt access commands being performed on the memory device 425. For example, the signals may be sent concurrently and the multimedia controller 420 may process and store the data upon interrupting access operations being performed.

In some examples, the signal path 450 may include multiple signal paths that are each configured to communicate a subset of information regarding the error condition. For example, the second signal path 450 may include three (3) signal paths (e.g., three bit lines) that are coupled with respective GPIO pins of the CPU 435. Each of the signal paths may be configured to communicate a subset of signals that together indicate data associated with an error that occurred at the memory device 415-a. Including additional signal paths configured to communicate a subset of signals may allow for additional error-related information to be communicated from the subsystem 410-a to the subsystem 410-b.

The error-related information communicated from the memory device 415-a to the CPU 435 may be related to temperature errors, voltage errors, power errors, bit failure errors, or other types of errors that may occur at a memory device 415. For example, the second signal path 450 may include multiple signal paths configured to communicate a subset of signals and the type of error and/or information relating to the error may be indicated based on a quantity of bits communicated. One of the signal paths may indicate a type of abnormality (e.g., a temperature error) and the additional signal paths may indicate additional information relating to the error, such as whether the temperature of the memory device 415-a is low, high, extremely low, or extremely high. As discussed herein, by including additional signal paths in the second signal path 450, additional information may be communicated from the memory device 415-a to the multimedia controller 420.

Upon receiving the interrupt signal and the error-related information from the memory device 415-a, the multimedia controller 420 may store the data to the memory device 425. The stored data may be output (e.g., output to a host device via the interface 460) during an error debugging or correction operation and may be used to identify and correct a type of error that occurred at the memory device 415-a. In some examples (not shown), error-related information may be received from additional memory devices 415, such as memory device 415-b or memory device 415-n. In such examples, the memory devices 415 may be coupled with the multimedia controller 420 via respective signal paths and/or logic gates. Data relating to errors that occurred at the respective memory devices may be stored to the memory device 425 according to the methods described above. Utilizing the methods described herein may allow for a host device to determine and correct errors that occur on various memory devices of the memory system 405 that include different memory interfaces.

Figure 5:
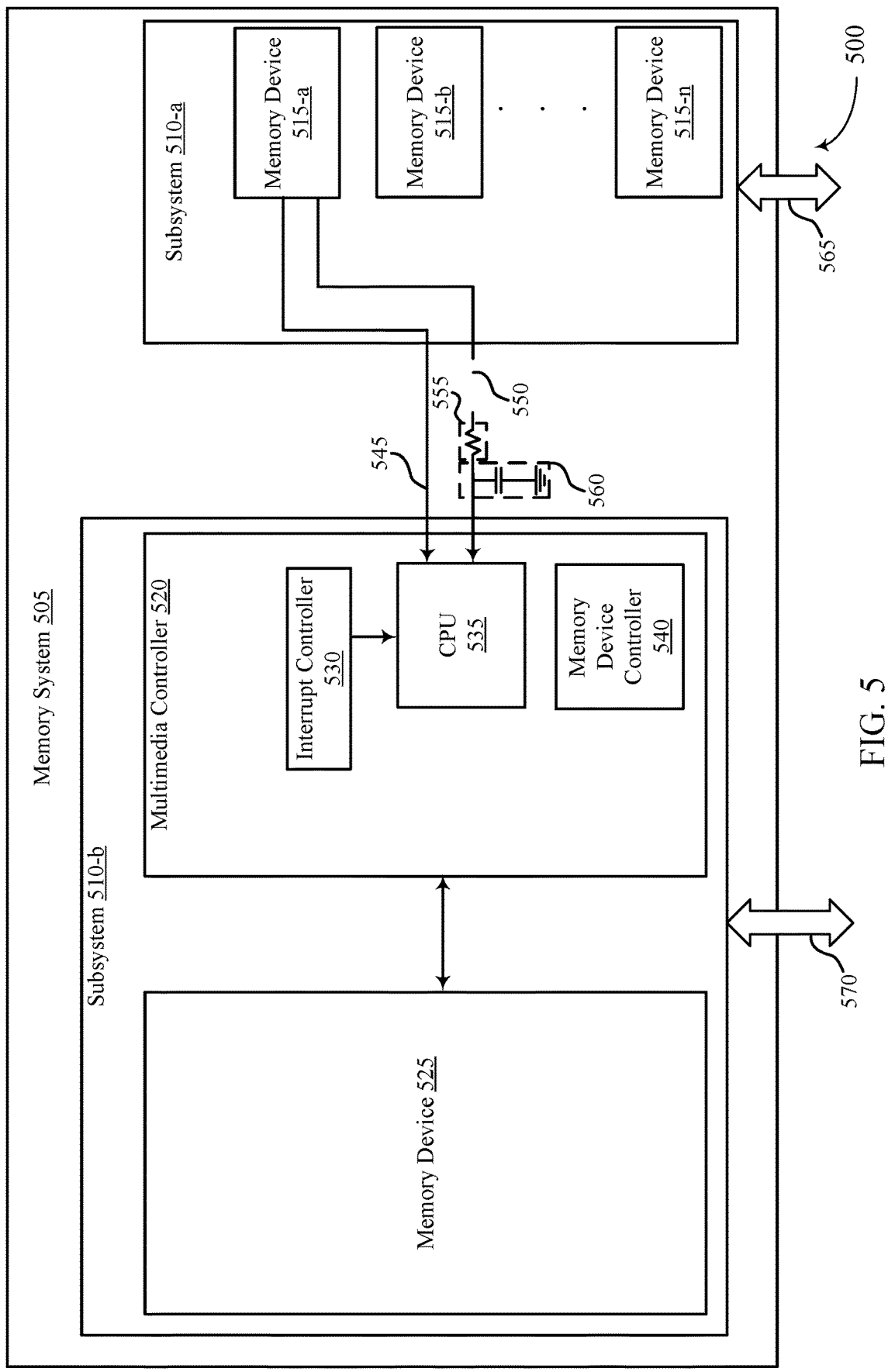

FIG. 5 illustrates a diagram 500 of an example memory system 505 that supports debugging memory devices in accordance with examples as disclosed herein. The memory system 505 may be an example of and/or may include similar components as the memory system 405 as described with reference to FIG. 4. In some examples, the memory system 505 may be referred to as a memory package, a memory chip, a memory device, or an electronic memory apparatus. The memory system 505 may include a memory subsystem 510-a and a memory subsystem 510-b. The memory subsystem 510-a may include one or more memory devices 515 that each include one or more memory cells. The memory subsystem 510-b may include a memory device 525, which may include one or more memory cells that are different than the memory cells of the memory devices 515. The memory subsystem 510-b may include a multimedia controller 520 that is configured to interface with the subsystem 510-a and may store data to the memory device 525. The stored data may be associated with errors that occur at the memory devices 515 and may be used to debug an associated memory device 515. Additionally or alternatively, storing the data to the memory device 525 may allow for a host device to determine and correct errors that occur on various memory devices of the memory system 505 that include different memory interfaces.

The memory subsystem 510-a may include multiple memory devices 515-a, such as a first memory device 515-a, a second memory device 515-b, and an Nth memory device 515-n where N is any positive integer. The memory devices 515 may include one or more memory cells of a first type, which may be SRAM, DRAM, or other volatile memory cells. The memory subsystem 410-a may include a memory interface 565 (e.g., a first memory interface). In some examples, the memory subsystem 510-a may include multiple memory interfaces 565, where each memory interface 565 is coupled with one or a subset of the memory devices 515. For example, the memory subsystem 510-a may include multiple channels, where each channel includes a memory interface 565 for performing memory operations on one or more memory devices 515. In some examples, the memory device 515-a may include at least one pin coupled with a first signal path 545 and one or more additional pins coupled with a second signal path 550 for communicating data from the memory devices 115 of the subsystem 510-a to the subsystem 510-b.

The memory subsystem 510-b may include a multimedia controller 520 (e.g., an eMMC, a UFS controller) and a memory device 525. The multimedia controller 520 may include an interrupt controller 530, a CPU 535, and/or a memory device controller 540. In some examples, the operations performed by the interrupt controller 530, the CPU 535, and the memory device controller 540 as described herein may be performed by a single component of the multimedia controller 520, such as the CPU 535.

The memory subsystem 510-b may include a memory device 525 that includes one or more memory cells of a second type, which may be flash memory cells (e.g., NAND memory cells). The multimedia controller 520 may include a memory interface 570 (e.g., a second memory interface) for memory access commands associated with the memory device 525. In some examples, the multimedia controller 520 may include at least one pin coupled with the first signal path 545 and one or more additional pins coupled with the second signal path 550. The pins coupled with the signal paths may be analog-to-digital conversion (ADC) pins and may be used to convert an analog signal received from the memory devices 515 to a digital value (e.g., a digital signal). The analog signal and/or digital value may indicate errors that occur at the memory devices 515, and the digital value may be stored (e.g., saved) to the memory device 525.

In some examples, the multimedia controller 520 may perform access commands (e.g., read commands, write commands) on the memory device 525. The multimedia controller 520 may also save error-related data associated with the subsystem 510-a to the memory device 525. In order to save error-related data associated with one or more memory devices 515 of the subsystem 510-a, any access commands being performed on the memory device 525 may first be paused (e.g., interrupted). To interrupt the access commands, a signal (e.g., a first signal, an interrupt signal)

may be communicated from the memory device 515-*a* to the multimedia controller 520 via the signal path 545. In some examples, the signal may be received by the interrupt controller 530 and the interrupt controller may communicate with the CPU 535 to interrupt any access operations being performed on the memory device 125. In other examples the signal may be received directly by the CPU 535 or any other component of the multimedia controller 520 configured to perform access commands on the memory device 525.

When any access commands being performed on the memory device 525 are interrupted (e.g., paused), error-related data may be communicated from the memory device 515-*a* to the multimedia controller 520 via the signal path 550. The signal path 550 may be coupled with an ADC pin (used for an analog-to-digital conversion) that is configured to convert an analog signal communicated from the memory device 515-*a* to a digital value. In some examples, the signal path 550 may include a resistor 555 and a capacitor 560 coupled in series. The resistor 555 and capacitor 560 may be or may be referred to as an RC circuit.

When an error occurs at the memory device 515-*a*, signal may be communicated to the multimedia controller 520 via the signal path 550. In some examples, the signal may be a pulse width modulation (PWM) signal having a pulse width corresponding to the type of error that occurred at the memory device. For example, a signal having a first pulse width may indicate a first type of error (e.g., a temperature related error) and a signal having a second pulse width (e.g., a different pulse width) may indicate a second, different type of error (e.g., a voltage related error) at the memory device 515-*a*. The pulse width may be modified to indicate various types of abnormalities (e.g., a temperature error) and/or information relating to an error, such as a value corresponding to the temperature of the memory device 515-*a* (e.g., within a range such as low, high, extremely low, or extremely high, or corresponding to the measured value).

The signal may be communicated via the signal path 550 and may be stored (e.g., filtered or averaged) at the capacitor 560, and the rate at which the capacitor 560 charges may be controlled by the resistor 555. In some examples, the charge stored at the capacitor 560 may be provided to the ADC pin for conversion to a digital value. The conversion may be performed by an ADC block coupled with the ADC pin. The ADC block may generate a digital value based on the analog signal (e.g., based on the charge stored at the capacitor 560), and the digital value may represent the type and/or information relating to the error at the memory device 515-*a*. Using an ADC pin and/or ADC block may allow for relatively complex error-related data to be communicated from the memory device 515-*a* using a single signal path (e.g., using only signal path 550).

The error-related information communicated from the memory device 515-*a* to the CPU 535 may be related to temperature errors, voltage errors, power errors, bit failure errors, or other types of errors that may occur at a memory device 515. Upon receiving the interrupt signal and the error-related information from the memory device 515-*a*, the multimedia controller 520 may store the data to the memory device 525. The stored data may be output during an error correction operation and may be used to identify and correct a type of error that occurred at the memory device 515-*a*. Utilizing the methods described herein may allow for a host device to determine and correct errors that occur on various memory devices of the memory system 405 that include different memory interfaces.

Figure 6:
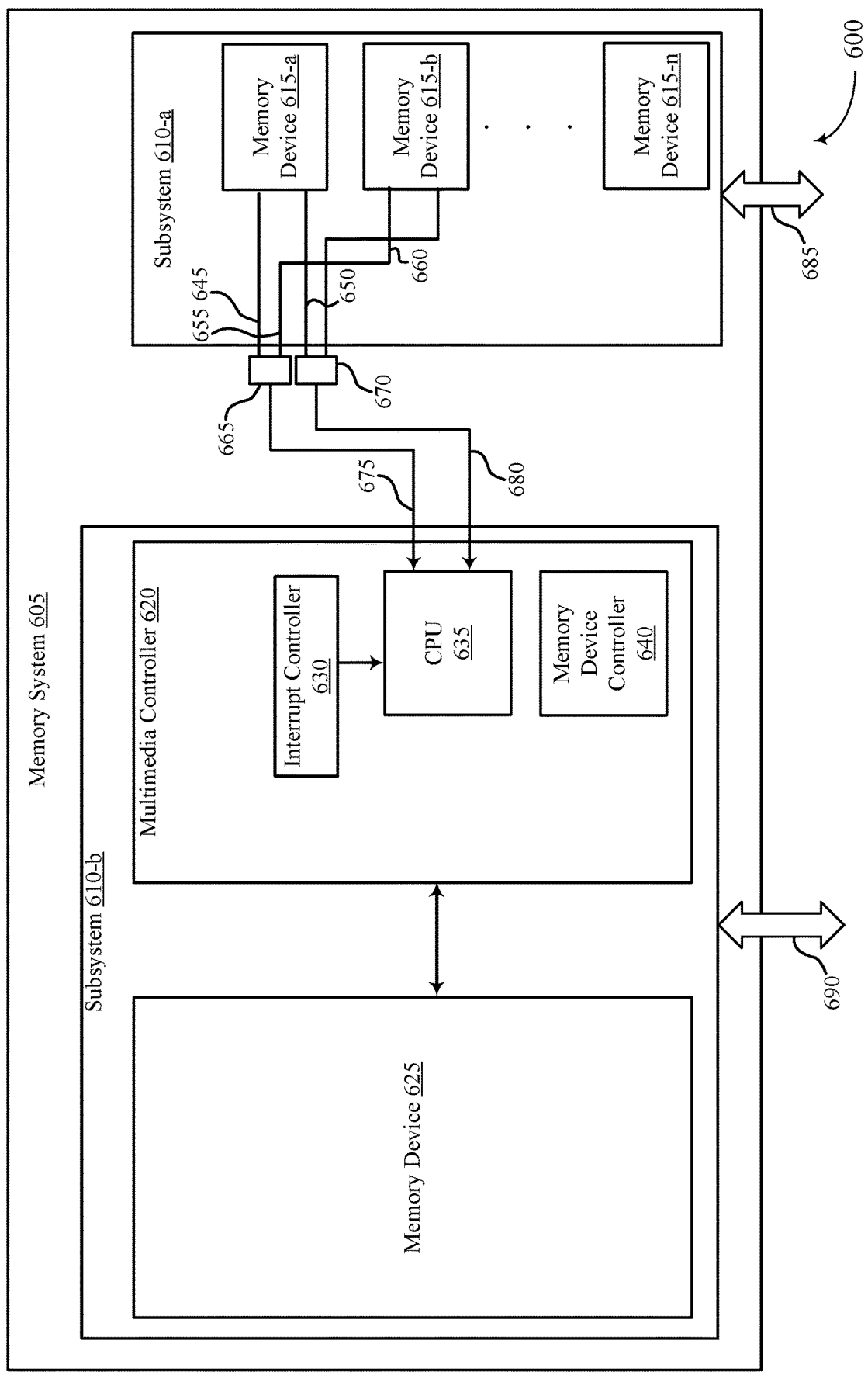

FIG. 6 illustrates a diagram 600 of an example memory system 605 that supports debugging memory devices in accordance with examples as disclosed herein. The memory system 605 may be an example of and/or may include similar components as the memory system 405 and/or the memory system 505 as described with reference to FIGS. 4 and 5. In some examples, the memory system 605 may be referred to as a memory package, a memory chip, a memory device, or an electronic memory apparatus. The memory system 605 may include a memory subsystem 610-*a* and a memory subsystem 610-*b*. The memory subsystem 610-*a* may include one or more memory devices 615 that each include one or more memory cells. The memory subsystem 610-*b* may include a memory device 625, which may include one or more memory cells that are different than the memory cells of the memory devices 615. The memory subsystem 610-*b* may include a multimedia controller 620 that is configured to interface with the subsystem 610-*a* and may store data to the memory device 625. The stored data may be associated with errors that occur at the memory devices 615 and may be used to debug an associated memory device 615. Additionally or alternatively, storing the data to the memory device 625 may allow for a host device to determine and correct errors that occur on various memory devices of the memory system 605 that include different memory interfaces The memory subsystem 610-*a* may include a plurality of memory devices 615-*a*, such as a first memory device 615-*a*, a second memory device 615-*b*, and an Nth memory device 615-*n* where N is any positive integer. The memory devices 615 may include one or more memory cells of a first type, which may be DRAM memory cells. The memory subsystem 610-*a* may include a memory interface 685 (e.g., a first memory interface). In some examples, the memory subsystem 610-*a* may include multiple memory interfaces 685, where each memory interface 685 is coupled with one or a subset of the memory devices 615. For example, the memory subsystem 610-*a* may include multiple channels, where each channel includes a memory interface 685 for performing memory operations on one or more memory devices 615.

In some examples, the memory device 615-*a* may include at least one pin coupled with a first signal path 645 and one or more additional pins coupled with a second signal path 650. Additionally or alternatively, the memory device 615-*b* (e.g., the second memory device 615-*b*) may include at least one pin coupled with a third signal path 655 and one or more additional pins coupled with a fourth signal path 660. The first signal path 645 and the third signal path 655 may be coupled with a logic gate 665, and the second signal path 650 and the fourth signal path may be coupled with a logic gate 670. The logic gate 665 and the logic gate 670, which may be OR logic gates (or any other types or combinations of digital logic gates), may be configured to pass a signal to the multimedia controller 620 based on data communicated via one of the signal paths. The data may be communicated to the multimedia controller 620 via the signal path 675 that is associated with the logic gate 665 and/or the signal path 680 that is associated with the logic gate 670.

The memory subsystem 610-*b* may include a multimedia controller 620 (e.g., an eMMC, a UFS controller) and a memory device 625. The multimedia controller 620 may include an interrupt controller 630, a CPU 635, and/or a memory device controller 640. In some examples, the operations performed by the interrupt controller 630, the CPU 635, and the memory device controller 640 as described herein may be performed by a single component of the multimedia controller 620, such as the CPU 635.

The memory subsystem 610-*b* may include a memory device 625 that includes one or more memory cells of a second type, which may be flash memory cells (e.g., NAND memory cells). The multimedia controller 620 may include a memory interface 690 (e.g., a second memory interface) for memory access commands associated with the memory device 625. In some examples, the multimedia controller 620 may include at least one pin coupled with the signal path 675 and one or more additional pins coupled with the signal path 680. The pins coupled with the signal paths may be general purpose input/output (GPIO) pins and may be used to receive data from the memory devices 615. As discussed herein, the data may indicate errors that occur at the memory devices 615 and may be stored (e.g., saved) to the memory device 625.

In some examples, the multimedia controller 620 may perform access commands (e.g., read commands, write commands) on the memory device 625. The multimedia controller 620 may also save error-related data associated with the subsystem 610-*a* to the memory device 625. In order to save error-related data associated with one or more memory devices 615 of the subsystem 610-*a*, any access commands being performed on the memory device 625 may first be paused (e.g., interrupted). To interrupt the access commands, a signal (e.g., an interrupt signal) may be communicated from the memory device 615-*a* or the memory device 615-*b* to the multimedia controller 620 via the signal path 675. In some examples, the signal may be received by the interrupt controller 630 and the interrupt controller may communicate with the CPU 635 to interrupt any access operations being performed on the memory device 625. In other examples the signal may be received directly by the CPU 635 or any other component of the multimedia controller 620 configured to perform access commands on the memory device 625.

The interrupt signal may be communicated to the multimedia controller 620 using the logic gate 665. In some examples, the logic gate 665 may be an OR logic gate such that if the first signal path 645 or the third signal path 655 communicate a relatively high (e.g., relative to a ground voltage, over a threshold voltage) voltage value (e.g., indicating an interrupt signal), the logic gate 665 will output a relatively high voltage value corresponding to the interrupt signal. In other examples, the first signal path 645 and the third signal path 655 may both communicate a relatively high voltage value, which may result in the logic gate 665 outputting a relatively high voltage value corresponding to the interrupt signal.

When any access commands being performed on the memory device 625 are interrupted (e.g., paused), an additional signal or signals may be communicated from the memory device 615-*a* and/or the memory device 615-*b* to the multimedia controller 620 via the signal path 680. In some examples, the signal path 680 may include multiple signal paths that are each configured to communicate a subset of signals. For example, the second signal path 650 and/or the fourth signal path 660 may each include three (3) signal paths (e.g., three bit lines) configured to communicate a subset of signals that together indicate data associated with an error that occurred at a respective memory device 615. Accordingly, the signal path 680 may include a corresponding quantity of signal paths (e.g., three signal paths) that are coupled with respective GPIO pins of the CPU 635. Each of the signal paths may be configured to communicate a subset of signals that together indicate data associated with an error that occurred at the memory device 615-*a* or the memory device 615-*b*. Including additional signal paths configured to communicate a subset of signals may allow for additional error-related information to be communicated from the subsystem 610-*a* to the subsystem 610-*b*.

The error-related information communicated from the memory device 615-*a* to the CPU 635 may be related to temperature errors, voltage errors, power errors, bit failure errors, or other types of errors that may occur at a memory device 615. For example, the fourth signal path 660 may include multiple signal paths configured to communicate a subset of signals. One of the signal paths may indicate a type of abnormality (e.g., a temperature error) and the additional signal paths may indicate additional information relating to the error, such as whether the temperature of the memory device 615-*b* is low, high, extremely low, or extremely high. When at least one of the signal paths are high (e.g., when at least one of the signal paths communicate such error-related data), the logic gate 670 may output a corresponding voltage value to each of the signal paths of the signal path 680. The corresponding data may be communicated to the multimedia controller 620 for storing at the memory device 625. In some cases, the logic gate 670 may be implemented as a multiplexer, having a control input of either signal 645 or 655, thus selecting one of the signals 650 or 660, depending on wither the signal 645 or signal 655 was asserted.

Upon receiving the interrupt signal and the error-related information from the logic gate 665 and the logic gate 670, respectively, the multimedia controller 620 may store the data to the memory device 625. The stored data may be output during an error correction operation and may be used to identify and correct a type of error that occurred at the memory device 615-*a* or the memory device 615-*b*. Utilizing the methods described herein may allow for a host device to determine and correct errors that occur on various memory devices of the memory system 405 that include different memory interfaces.

Figure 7:
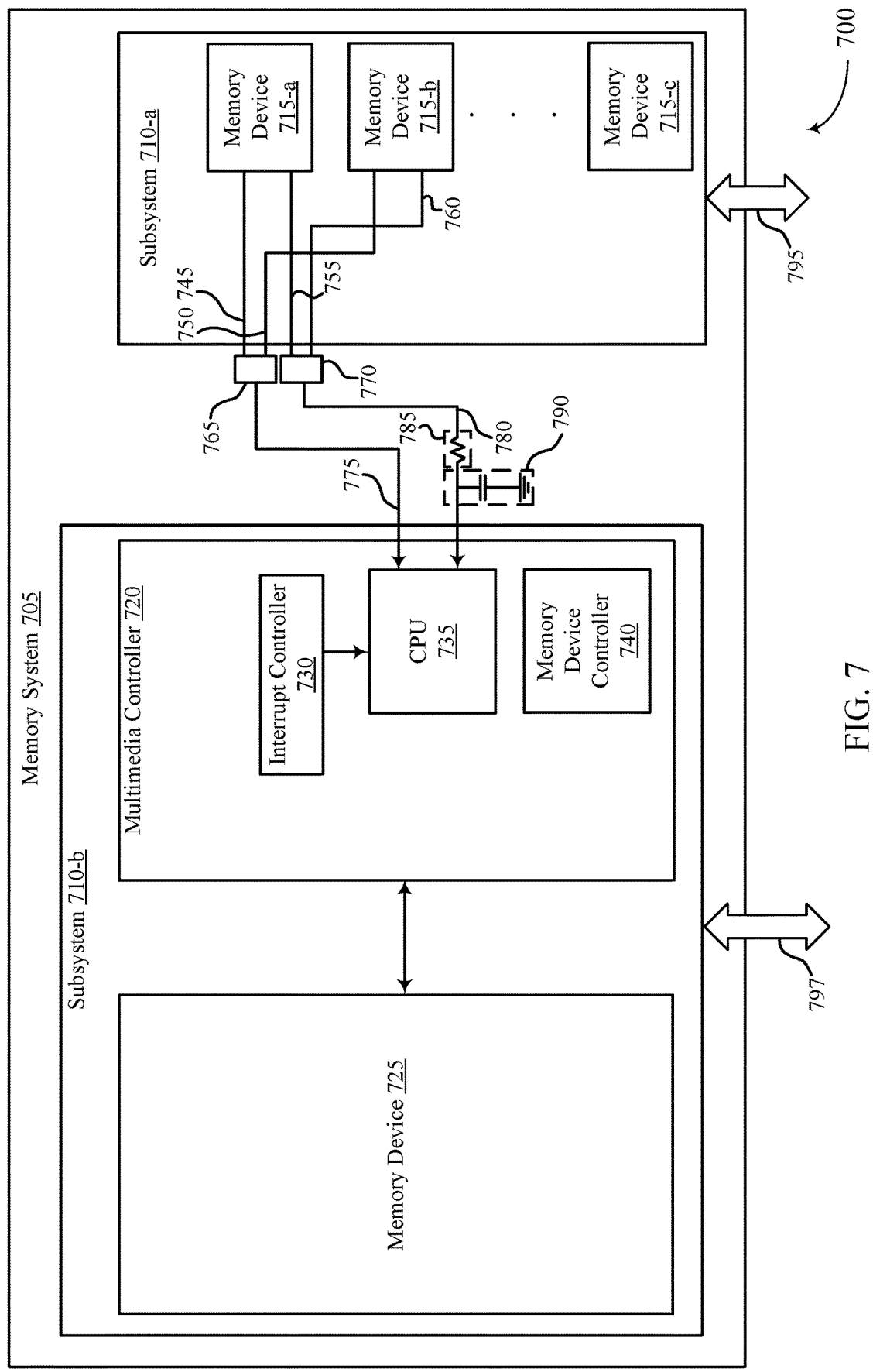

FIG. 7 illustrates a diagram 700 of an example memory system 705 that supports debugging memory devices in accordance with examples as disclosed herein. The memory system 705 may be an example of and/or may include similar components as the memory system 405, the memory system 505, and/or the memory system 605 as described with reference to FIGS. 4 through 6. In some examples, the memory system 705 may be referred to as a memory package, a memory chip, a memory device, or an electronic memory apparatus. The memory system 705 may include a memory subsystem 710-*a* and a memory subsystem 710-*b*. The memory subsystem 710-*a* may include one or more memory devices 715 that each include one or more memory cells. The memory subsystem 710-*b* may include a memory device 725, which may include one or more memory cells that are different than the memory cells of the memory devices 715. The memory subsystem 710-*b* may include a multimedia controller 720 that is configured to interface with the subsystem 710-*a* and may store data to the memory device 725. The stored data may be associated with errors that occur at the memory devices 715 and may be used to debug an associated memory device 715. Additionally or alternatively, storing the data to the memory device 725 may allow for a host device to determine and correct errors that occur on various memory devices of the memory system 705 that include different memory interfaces The memory subsystem 710-*a* may include a plurality of memory devices 715-*a*, such as a first memory device 715-*a*, a second memory device 715-*b*, and an Nth memory device 715-*n* where N is any positive integer. The memory devices 715 may include one or more memory cells of a first type, which may be DRAM memory cells. The memory subsystem 710-*a* may include a memory interface 795 (e.g., a first memory interface). In some examples, the memory subsystem 710-*a* may include multiple memory interfaces 795, where each memory interface 795 is coupled with one or a subset of the memory devices 715. For example, the memory subsystem 710-*a* may include multiple channels, where each channel includes a memory interface 795 for performing memory operations on one or more memory devices 715.

In some examples, the memory device 715-*a* may include at least one pin coupled with a first signal path 745 and one or more additional pins coupled with a second signal path 750. Additionally or alternatively, the memory device 715-*b* (e.g., the second memory device 715-*b*) may include at least one pin coupled with a third signal path 755 and one or more additional pins coupled with a fourth signal path 760. The first signal path 745 and the third signal path 755 may be coupled with a logic gate 765, and the second signal path 750 and the fourth signal path may be coupled with a logic gate 770. The logic gate 765 and the logic gate 770, which may be OR logic gates (or any other types of digital logic gates), may be configured to pass a signal to the multimedia controller 720 based on data communicated via one of the signal paths. The data may be communicated to the multimedia controller 720 via the signal path 775 that is associated with the logic gate 765 and/or the signal path 780 that is associated with the logic gate 770.

The memory subsystem 710-*b* may include a multimedia controller 720 (e.g., an eMMC, a UFS controller) and a memory device 725. The multimedia controller 720 may include an interrupt controller 730, a CPU 735, and/or a memory device controller 740. In some examples, the operations performed by the interrupt controller 730, the CPU 735, and the memory device controller 740 as described herein may be performed by a single component of the multimedia controller 720, such as the CPU 735.

The memory subsystem 710-*b* may include a memory device 725 that includes one or more memory cells of a second type, which may be flash memory cells (e.g., NAND memory cells). The multimedia controller 720 may include a memory interface 797 (e.g., a second memory interface) for memory access commands associated with the memory device 725. In some examples, the multimedia controller 720 may include at least one pin coupled with the signal path 775 and one or more additional pins coupled with the signal path 780. The pins coupled with the signal paths may be analog-to-digital conversion (ADC) pins and may be used to convert an analog signal received from the memory devices 715 to a digital value (e.g., a digital signal). The analog signal and/or digital value may indicate errors that occur at the memory devices 715, and the digital value may be stored (e.g., saved) to the memory device 725.

In some examples, the multimedia controller 720 may perform access commands (e.g., read commands, write commands) on the memory device 725. The multimedia controller 720 may also save error-related data associated with the subsystem 710-*a* to the memory device 725. In order to save error-related data associated with one or more memory devices 715 of the subsystem 710-*a*, any access commands being performed on the memory device 725 may first be paused (e.g., interrupted). To interrupt the access commands, a signal (e.g., an interrupt signal) may be communicated from the memory device 715-*a* or the memory device 715-*b* to the multimedia controller 720 via the signal path 775. In some examples, the signal may be received by the interrupt controller 730 and the interrupt controller may communicate with the CPU 735 to interrupt any access operations being performed on the memory device 725. In other examples the signal may be received directly by the CPU 735 or any other component of the multimedia controller 720 configured to perform access commands on the memory device 725.

The interrupt signal may be communicated to the multimedia controller 720 using the logic gate 765. In some examples, the logic gate 765 may be an OR logic gate such that if the first signal path 745 or the third signal path 755 communicate a relatively high voltage value (e.g., indicating an interrupt signal), the logic gate 765 will output a relatively high voltage value corresponding to the interrupt signal. In other examples, the first signal path 745 and the third signal path 755 may both communicate a relatively high voltage value, which may result in the logic gate 765 outputting a relatively high voltage value corresponding to the interrupt signal.

When any access commands being performed on the memory device 725 are interrupted (e.g., paused), error-related data may be communicated from the memory device 715-*a* or the memory device 715-*b* to the multimedia controller 720 via the signal path 780. The signal path 780 may be coupled with an ADC pin (used for an analog-to-digital conversion) that is configured to convert an analog signal communicated from the memory device 715-*a* and/or the memory device 715-*b* to a digital value. In some examples, the signal path 270 may include a resistor 785 and a capacitor 790 coupled in series. The resistor 785 and capacitor 790 may be or may be referred to as an RC circuit.

When an error occurs at the memory device 715-*a* or the memory device 715-*b*, signal may be communicated to the multimedia controller 720 via the signal path 780. For example, an error may occur at the memory device 715-*a* thus causing the second signal path 755 to communicate a relatively high voltage value to the logic gate 770. Because the logic gate 770 may be an OR logic gate, the relatively high voltage value may be communicated to the signal path 780. In some examples, the signal communicated to the signal path 780 may be a pulse width modulation (PWM) signal having a pulse width corresponding to the type of error that occurred at the memory device. For example, a signal having a first pulse width may indicate a first type of error (e.g., a temperature related error) and a signal having a second pulse width (e.g., a different pulse width) may indicate a second, different type of error (e.g., a voltage related error) at the memory device 715-*a* or the memory device 715-*b*. The pulse width may be modified to indicate various types of abnormalities (e.g., a temperature error) and/or information relating to an error, such as whether the temperature of the corresponding memory device is low, high, extremely low, or extremely high. Use of an OR gate may result in the information relating to the error corresponding to a highest or combined value of the signals 750 and 760. For example, the signal on signal path 780 may correspond to a highest or combined PWM value between signals 750 and 760.

The signal may be communicated via the signal path 780 via the logic gate 770 and may be stored at the capacitor 790, and the rate at which the capacitor 790 charges may be controlled by the resistor 785. In some examples, the charge stored at the capacitor 790 may be provided to the ADC pin for conversion to a digital value. The conversion may be performed by an ADC block coupled with the ADC pin. The ADC block may generate a digital value based on the analog signal (e.g., based on the charge stored at the capacitor 790), and the digital value may represent the type and/or information relating to the error at the corresponding memory device. Using an ADC pin and/or ADC block may allow for relatively complex error-related data to be communicated from the memory device 715-a using a single signal path (e.g., using only signal path 780). In some cases, the logic gate 770 may be implemented as a multiplexer, having a control input of either signal 745 or 755, thus selecting one of the signals 750 or 760, depending on wither the signal 745 or signal 755 is asserted.

The error-related information communicated from the memory device 715-a or the memory device 715-b to the CPU 735 may be related to temperature errors, voltage errors, power errors, bit failure errors, or other types of errors that may occur at a memory device 715. Upon receiving the interrupt signal and the error-related information, the multimedia controller 720 may store the data to the memory device 725. The stored data may be output during an error correction operation and may be used to identify and correct a type of error that occurred at the memory device 715-a. Utilizing the methods described herein may allow for a host device to determine and correct errors that occur on various memory devices of the memory system 405 that include different memory interfaces.

Figure 8:
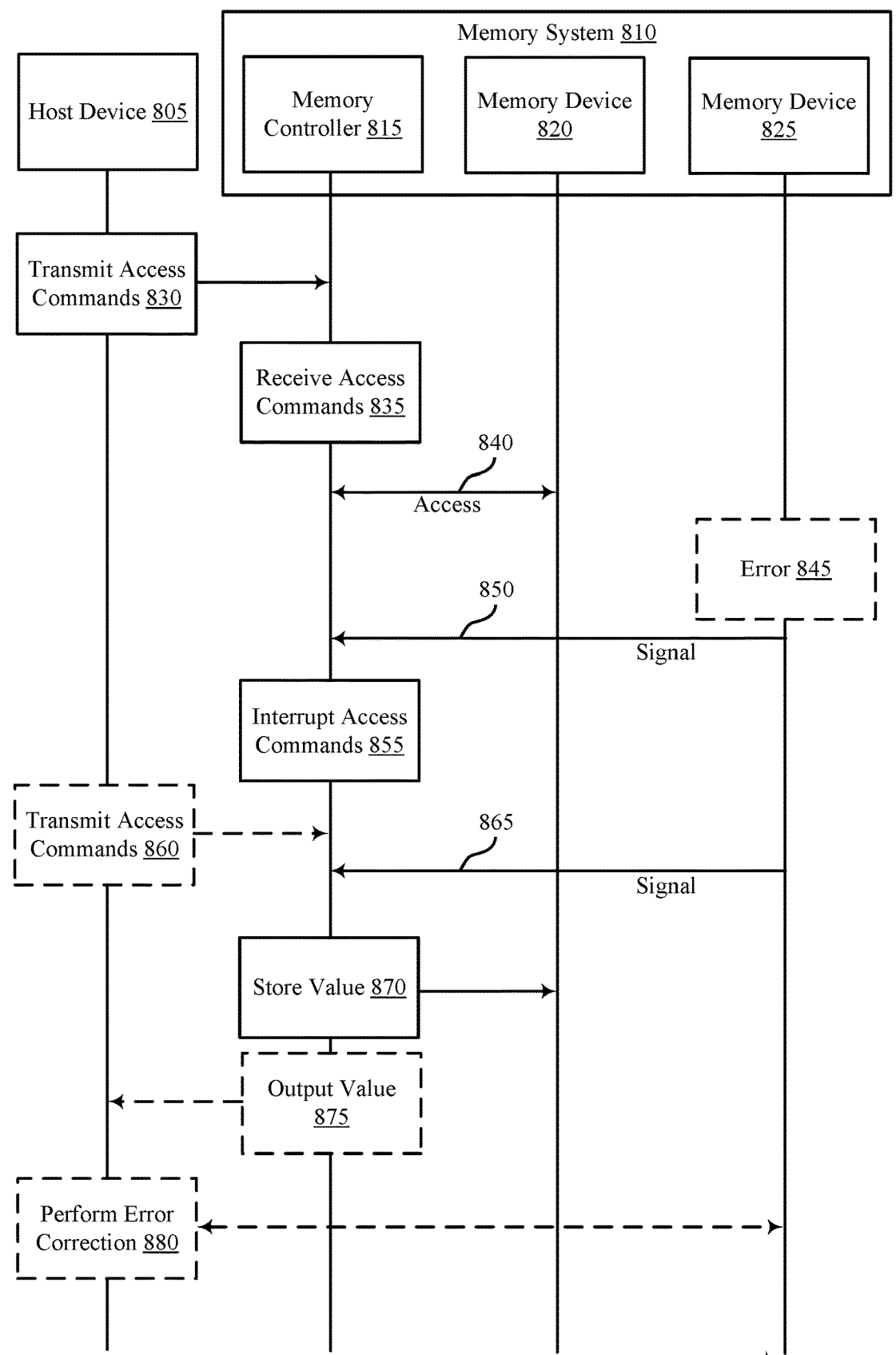
FIG. 8 illustrates an example of a process flow diagram that that supports debugging memory devices in accordance with examples as disclosed herein.

FIG. 8 illustrates an example of a process flow diagram 800 that supports debugging memory devices in accordance with examples as disclosed herein. The process flow diagram 800 may illustrate one or more operations of a host device 805 and a memory system 810, which may be an example of a memory system as discussed with reference to FIGS. 4 through 7. In some examples, the memory system 810 may include a memory controller 815, a memory device 820, and a memory device 825. The memory controller 815 may be an example of a multimedia controller as discussed with reference to FIGS. 4 through 7, and the memory device 820 and the memory devices 825 may be an example of the memory devices discussed with reference to FIGS. 4 through 7. For example, the memory device 820 may include one or more non-volatile memory cells, such as NAND memory cells, and the memory device 825 may include one or more volatile memory cells, such as DRAM memory cells. The memory device 825 may communicate with the memory controller 815 to interrupt access operations being performed on the memory device 820 and store error-related data.

At 830, the host device 805 may transmit one or more access commands to the memory system 810. The access commands issued by the host device 805 at 830 may be transmitted to the memory controller 815 and may be for the memory device 820. In some examples, the access commands may include read commands, write commands, commands for operations such as wear-leveling operations, garbage collection operations, error control operations such as error-detecting operations or error-correcting operations, encryption operations, caching operations, media management operations, background refresh, health monitoring, and address translations between logical addresses and physical addresses. In other examples (not shown), the host device 805 may transmit one or more access commands to the memory controller 815 for the memory device 825.

At 835, the memory controller 815 may receive the access commands transmitted by the host device 805. The memory controller 815 may process the access commands and, at 840, may issue the access commands to the memory device 820. In some examples, the memory controller 815 may communicate data associated with the access commands to the host device 805. For example, during a read operation the memory controller 815 may read data from the memory device 820 and transmit the read data to the host device 805.

At 845, an error may occur at the memory device 825. As discussed herein, the error may be related to temperature errors, voltage errors, power errors, bit failure errors, or another type of error. The error may occur during an access operation of the memory device 825. In some examples, the error may be detected by the memory controller 815 or another device, such as a local memory controller (e.g., a memory controller local to the memory device 825) that is not shown.

At 850, the memory device 825 may transmit a signal (e.g., a first signal, an interrupt signal) to the memory controller 815 based on the detection of the error. The signal may be transmitted via a signal path, such as the signal path 445 as described with reference to FIG. 4. The signal path may be coupled with the memory device and at least one pin of the memory controller 815. The signal may be configured to interrupt access commands being performed by the memory controller 815. For example, the signal may be configured to interrupt access commands being performed by the memory controller 815 on the memory device 820.

At 855, the memory controller 815 may interrupt one or more access commands based on receiving the signal at 850. The memory controller 815 may interrupt one or more operations associated with an access command while continuing to receive access commands from the host device 805. For example, at 860 the host device 805 may continue transmitting access commands to the memory controller 815. The memory controller 815 may interrupt (e.g., pause) any access commands being processed and may store the received access commands (e.g., the access commands transmitted at 860) in temporary storage (e.g., in a cache).

The operations associated with the access commands may be paused for a predetermined duration, or until the error-related information is saved to the memory device 820. Once the predetermined duration has been surpassed or the error-related information is saved to the memory device 820, the memory controller 815 may continue processing access commands that were saved to temporary storage and/or that are received from the host device 805. The memory controller 815 may process the access commands in a same order that the commands were received from the host device 805.

At 865, the memory device 825 may transmit a signal (e.g., a second signal) to the memory controller 815. The signal may be an example of the signal described with reference to FIGS. 4 through 7, and thus may be received via a signal path coupled with a pin of the memory controller 815. As described herein, the pin may be a GPIO pin or an ADC pin, for example. The signal may communicate information related to the error that occurred at the memory device 825 (at 845).

At 870, the memory controller 815 may store a value associated with the second signal to the memory device 820. The value associated with the signal may be stored for use in a subsequent error correction operation. In some examples, the value may be based on a voltage value of one or more signal paths (e.g., bit lines). In other examples, the value may be a digital value resulting from the conversion of an analog voltage. In either instance, the stored value may indicate a type of error and/or information relating to the error for use by the host device 805.

At 875, the memory controller 815 may output the stored value to the host device 805. As described herein, the stored value may be used by the host device 805 for use in an error correction operation. The information associated with the value (e.g., the type of error and/or information relating to the error) may be used by the host device 805 to correct the error at the memory device 825. Accordingly, at 880 the host device 805 may use the output value to correct the error at the memory device 825.

Figure 9:
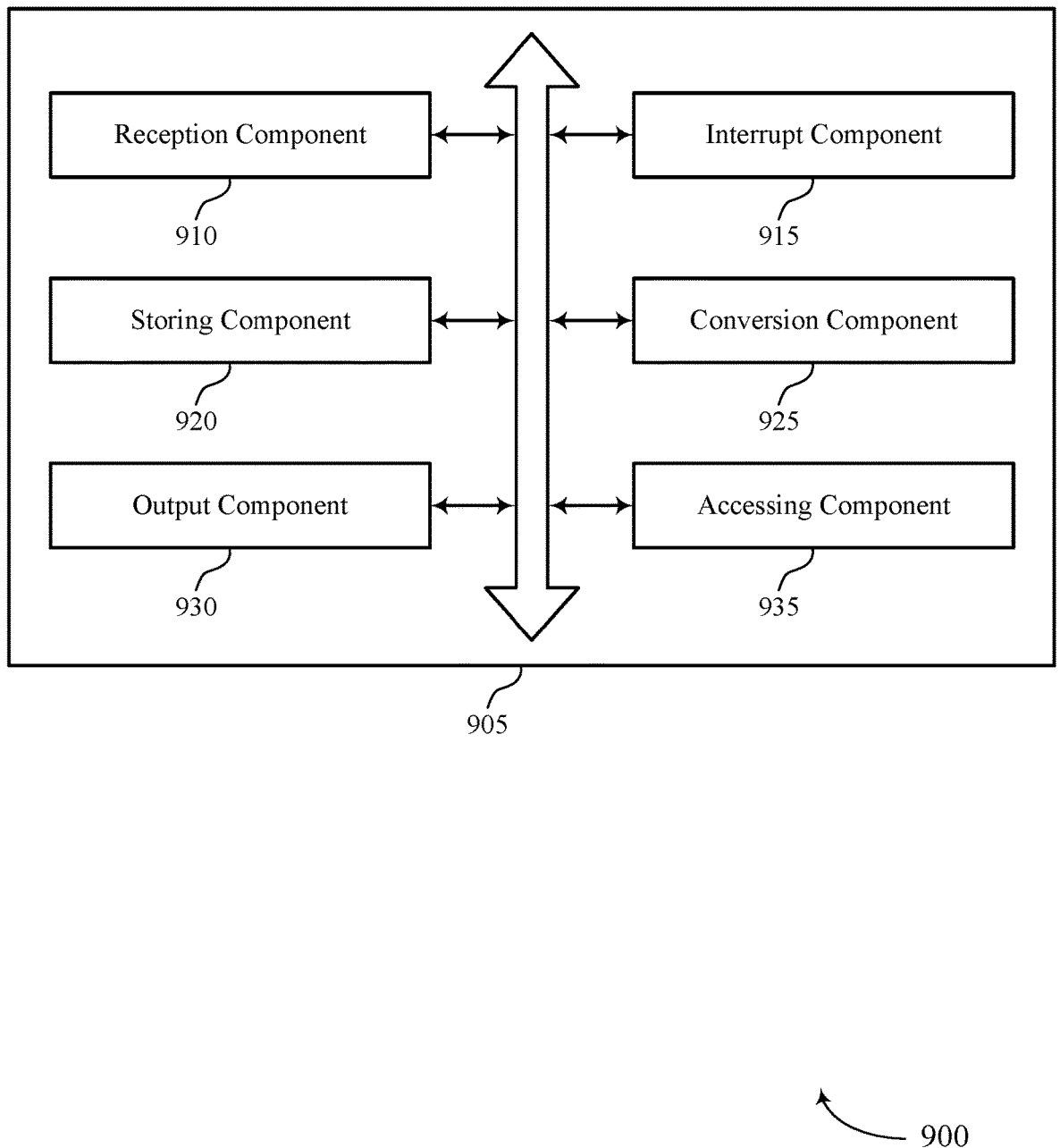
FIG. 9 shows a block diagram of a memory controller that supports debugging memory devices in accordance with examples as disclosed herein.

FIG. 9 shows a block diagram 900 of a memory controller 905 that supports debugging memory devices in accordance with examples as disclosed herein. The memory controller 905 may be an example of aspects of a memory controller as described with reference to FIGS. 4 through 7. The memory controller 905 may include a reception component 910, an interrupt component 915, a storing component 920, a conversion component 925, an output component 930, and an accessing component 935. Each of these modules may communicate, directly or indirectly, with one another (e.g., via one or more buses).

The reception component 910 may receive a first signal from a first memory device including a set of dynamic random access memory (DRAM) cells. In some examples, the reception component 910 may receive a second signal from the first memory device, where the second signal indicates one of a set of types of errors associated with the first memory device. In some examples, the reception component 910 may receive a third signal from a third memory device including a set of DRAM memory cells.

In some examples, the reception component 910 may receive a fourth signal from the third memory device that indicates one of the set of types of errors associated with the third memory device. In some examples, the reception component 910 may receive subsequent memory access commands for the second memory device associated with the second set of memory devices while the one or more processes associated with the memory access commands for the second memory device are interrupted.

The interrupt component 915 may interrupt one or more processes associated with memory access commands for a second memory device including a set of NAND memory cells. In some examples, the interrupt component 915 may interrupt the one or more processes associated with the memory access commands for the second memory device based on receiving the third signal.

The storing component 920 may store a value associated with the second signal at the second memory device based on receiving the first signal and the second signal. In some examples, the storing component 920 may store a second value associated with the fourth signal at the second memory device based on receiving the third signal and the fourth signal. In some examples, the storing component 920 may store the received subsequent memory access commands in temporary storage based on receiving the subsequent memory access commands while the one or more processes associated with the memory access commands for the second memory device are interrupted.

The conversion component 925 may convert an analog voltage corresponding to the second signal to a digital value indicating the one of the set of types of errors.

The output component 930 may output the stored value associated with the second signal during an error checking and correction operation, where the stored value indicates a type of error of the set of types of errors associated with the first memory device.

The accessing component 935 may process the received subsequent memory access commands after resuming processing the interrupted processes associated with the memory access commands for the second memory device.

Figure 10:
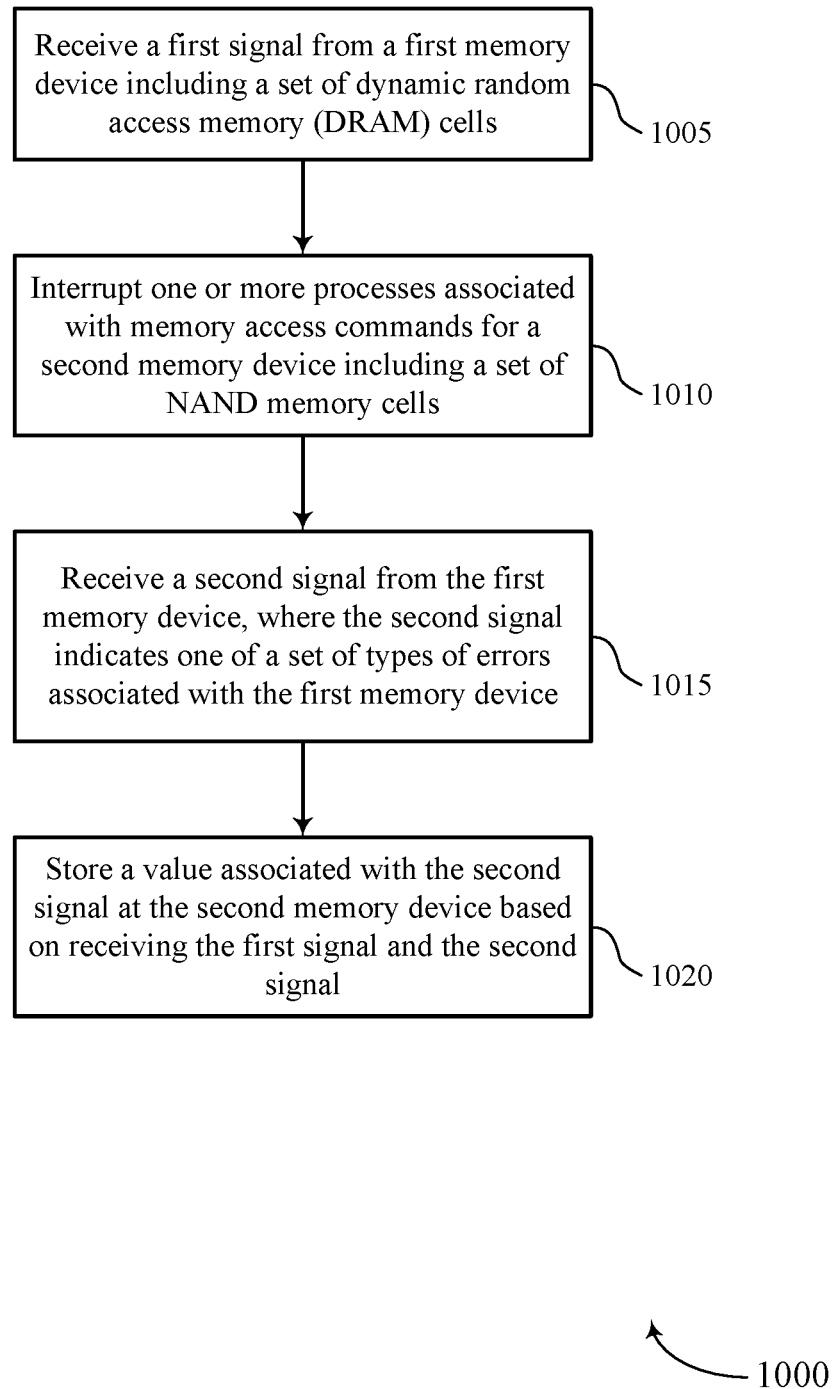
FIG. 10 shows a flowchart illustrating a method or methods that support debugging memory devices in accordance with examples as disclosed herein.

FIG. 10 shows a flowchart illustrating a method or methods 1000 that supports debugging memory devices in accordance with examples as disclosed herein. The operations of method 1000 may be implemented by a memory controller or its components as described herein. For example, the operations of method 1000 may be performed by a memory controller as described with reference to FIG. 9. In some examples, a memory controller may execute a set of instructions to control the functional elements of the memory controller to perform the described functions. Additionally or alternatively, a memory controller may perform aspects of the described functions using special-purpose hardware.

At 1005, the memory controller may receive a first signal from a first memory device including a set of dynamic random access memory (DRAM) cells. The operations of 1005 may be performed according to the methods described with reference to FIGS. 4 through 7. In some examples, aspects of the operations of 1005 may be performed by a reception component as described with reference to FIG. 9.

At 1010, the memory controller may interrupt one or more processes associated with memory access commands for a second memory device including a set of NAND memory cells. The operations of 1010 may be performed according to the methods described with reference to FIGS. 4 through 7. In some examples, aspects of the operations of 1010 may be performed by an interrupt component as described with reference to FIG. 9.

At 1015, the memory controller may receive a second signal from the first memory device, where the second signal indicates one of a set of types of errors associated with the first memory device. The operations of 1015 may be performed according to the methods described with reference to FIGS. 4 through 7. In some examples, aspects of the operations of 1015 may be performed by a reception component as described with reference to FIG. 9.

At 1020, the memory controller may store a value associated with the second signal at the second memory device based on receiving the first signal and the second signal. The operations of 1020 may be performed according to the methods described with reference to FIGS. 4 through 7. In some examples, aspects of the operations of 1020 may be performed by a storing component as described with reference to FIG. 9.

In some examples, an apparatus as described herein may perform a method or methods, such as the method 1000. The apparatus may include features, means, or instructions (e.g., a non-transitory computer-readable medium storing instructions executable by a processor) for receiving a first signal from a first memory device including a set of dynamic random access memory (DRAM) cells, interrupting one or more processes associated with memory access commands for a second memory device including a set of NAND memory cells, receiving a second signal from the first memory device, where the second signal indicates one of a set of types of errors associated with the first memory device, and storing a value associated with the second signal at the second memory device based on receiving the first signal and the second signal.

In some examples of the method 1000 and the apparatus described herein, receiving the second signal may include operations, features, means, or instructions for converting an analog voltage corresponding to the second signal to a digital value indicating the one of the set of types of errors.

Some examples of the method 1000 and the apparatus described herein may further include operations, features, means, or instructions for outputting the stored value associated with the second signal during an error checking and correction operation, where the stored value indicates a type of error of the set of types of errors associated with the first memory device.

Some examples of the method 1000 and the apparatus described herein may further include operations, features, means, or instructions for receiving a third signal from a third memory device including a set of DRAM memory cells, interrupting the one or more processes associated with the memory access commands for the second memory device based on receiving the third signal, receiving a fourth signal from the third memory device that indicates one of the set of types of errors associated with the third memory device, and storing a second value associated with the fourth signal at the second memory device based on receiving the third signal and the fourth signal.

In some examples of the method 1000 and the apparatus described herein, the first signal and the second signal may be received before the third signal and the fourth signal, and where the value stored to the second memory device indicates that an error occurred at the first memory device and the second value stored to the second memory device indicates that an error occurred at the third memory device.

Some examples of the method 1000 and the apparatus described herein may further include operations, features, means, or instructions for receiving subsequent memory access commands for the second memory device associated with the second set of memory devices while the one or more processes associated with the memory access commands for the second memory device may be interrupted, storing the received subsequent memory access commands in temporary storage based on receiving the subsequent memory access commands while the one or more processes associated with the memory access commands for the second memory device may be interrupted, and processing the received subsequent memory access commands after resuming processing the interrupted processes associated with the memory access commands for the second memory device.

In some examples of the method 1000 and the apparatus described herein, the value stored at the second memory device indicates a voltage abnormality, a temperature abnormality, or both associated with the first memory device.

It should be noted that the methods described herein describe possible implementations, and that the operations and the steps may be rearranged or otherwise modified and that other implementations are possible. Further, portions from two or more of the methods may be combined.

An apparatus is described. The apparatus may include a first memory device including a set of dynamic random access memory (DRAM) cells, a second memory device including a set of NAND memory cells, a controller coupled with the first memory device and the second memory device, the first memory device, the second memory device, and the controller within a single memory system package, where the controller is configured to, receive a first signal from the first memory device, interrupt one or more memory access commands of the second memory device based on receiving the first signal, receive, based on interrupting the one or more memory access commands of the second memory device, a second signal from the first memory device that indicates one of a set of types of errors associated with the first memory device, and store a value associated with the second signal to the second memory device based on receiving the first signal and the second signal.

Some examples may further include interrupt one or more memory access operations being performed on the second memory device based on receiving the first signal from the first memory device.

Some examples may further include output the stored value associated with the second signal via a memory interface associated with the second memory device.

Some examples may further include receiving an analog voltage corresponding to the first signal output by the first memory device, and convert the analog voltage into a digital value corresponding to an error of the set of types of errors associated with the first memory device.

In some examples, storing the value associated with the second signal to the second memory device may include operations, features, means, or instructions for storing the digital value corresponding to the error associated with the first memory device.

Some examples of the apparatus may include a third memory device including a set of DRAM memory cells, where the controller may be configured to, interrupt the one or more processes associated with one or more memory access commands for the second memory device based on receiving the third signal, receive a fourth signal from the third memory device that indicates one of the set of types of errors associated with the third memory device, and store a second value associated with the fourth signal at the second memory device based on receiving the third signal and the fourth signal.

Some examples of the apparatus may include a capacitor coupled with a signal path coupled with the first memory device and the controller, where the second signal received by the controller may be based on a charge stored at the capacitor.

In some examples, the charge stored to the capacitor may be based on a digital signal associated with the first memory device.

In some examples, the value stored at the second memory device indicates a voltage abnormality, a temperature abnormality, or both associated with the first memory device.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A system, comprising:
a first memory subsystem comprising a set of dynamic random access memory (DRAM) devices having a first memory interface for communicating first memory access commands associated with the set of DRAM devices with a host device, the first memory subsystem coupled with a first signal path and a second signal path; and
a second memory subsystem comprising a controller and a set of NAND devices, the second memory subsystem within a single memory system package with the first memory subsystem, wherein the controller comprises a second memory interface for communicating second memory access commands associated with the set of NAND devices with the host device, wherein the controller is coupled with the first signal path and the second signal path, and wherein the first signal path and the second signal path are different from the first memory interface and the second memory interface, the controller configured to receive signaling via the first signal path and the second signal path indicating one or more errors associated with the set of DRAM devices and to store data associated with the one or more errors to the set of NAND devices.

2. The system of claim 1, wherein the controller is configured to:
interrupt processing commands associated with the set of NAND devices to obtain the signaling via the second signal path based at least in part on the signaling received via the first signal path.

3. The system of claim 2, wherein the controller is configured to:
receive at least one additional second memory access command associated with the set of NAND devices while interrupting the processing of the commands associated with the set of NAND devices; and
store the received at least one additional second memory access command on a command queue for processing after resuming processing of the interrupted commands associated with the set of NAND devices.

4. The system of claim 1, wherein:
the first memory subsystem is configured to output a signal corresponding to a type of the one or more errors; and
the controller is configured to:
receive an analog voltage corresponding to the signal output by the first memory subsystem;
convert the analog voltage into a digital value corresponding to the type of the one or more errors associated with the set of DRAM devices; and
store the digital value associated with the type of the one or more errors to the set of NAND devices.

5. The system of claim 4, wherein the set of DRAM devices is configured to output a pulse width modulation (PWM) signal having a pulse width corresponding to the type of the one or more errors.

6. The system of claim 1, wherein the set of DRAM devices comprises:
a first bank of memory devices coupled with the first signal path and the second signal path, wherein the first bank of memory devices is associated with a first subset of signals of the first memory interface; and
a second bank of memory devices coupled with the first signal path and the second signal path, wherein the second bank of memory devices is associated with a second subset of signals of the first memory interface, wherein the controller is configured to receive signaling from the first bank of memory devices and the second bank of memory devices via the first signal path and the second signal path indicating one or more errors associated with the first bank of memory devices, the second bank of memory devices, or both and store data associated with the one or more errors to the set of NAND devices.

7. The system of claim 6, further comprising:
a first logic gate coupled with the first signal path, the first bank of memory devices, and the second bank of memory devices, wherein the first logic gate is configured to output signaling to the first signal path from the first bank of memory devices and the second bank of memory devices based at least in part on the first subset of signals, the second subset of signals, or both; and
a second logic gate coupled with the second signal path, the first bank of memory devices, and the second bank of memory devices, wherein the second logic gate is configured to output signaling to the second signal path from the first bank of memory devices and the second bank of memory devices based at least in part on the first subset of signals, the second subset of signals, or both.

8. The system of claim 7, wherein the second logic gate is coupled with:
a resistor; and
a capacitor, wherein the capacitor is configured to store a charge associated with the signaling indicating the one or more errors associated with the first bank of memory devices, the second bank of memory devices, or both based at least in part on the second logic gate outputting the signaling to the second signal path.

9. The system of claim 1, wherein the data associated with the one or more errors indicates a voltage abnormality, a temperature abnormality, or both associated with the set of DRAM devices.

10. A method, comprising:
receiving, via a first signal path, a first signal from a first memory device comprising a plurality of dynamic random access memory (DRAM) cells, wherein the first memory device is coupled with a first memory interface for communicating first memory access commands associated with the plurality of DRAM cells with a host device;
interrupting one or more processes associated with second memory access commands for a second memory device comprising a plurality of NAND cells, wherein the second memory device is coupled with a second memory interface for communicating the second memory access commands associated with the plurality of NAND cells with the host device;
receiving, via a second signal path, a second signal from the first memory device, wherein the second signal indicates one of a plurality of types of errors associated with the first memory device, wherein the first signal path and the second signal path are different than the first memory interface and the second memory interface; and
storing a value associated with the second signal at the second memory device based at least in part on receiving the first signal and the second signal.

11. The method of claim 10, wherein receiving the second signal comprises:
converting an analog voltage corresponding to the second signal to a digital value indicating the one of the plurality of types of errors.

12. The method of claim 10, further comprising:
outputting the stored value associated with the second signal during an error checking and correction operation, wherein the stored value indicates a type of error of the plurality of types of errors associated with the first memory device.

13. The method of claim 10, further comprising:
receiving a third signal from a third memory device comprising a plurality of DRAM memory cells;
interrupting the one or more processes associated with the second memory access commands for the second memory device based at least in part on receiving the third signal;
receiving a fourth signal from the third memory device that indicates one of the plurality of types of errors associated with the third memory device; and
storing a second value associated with the fourth signal at the second memory device based at least in part on receiving the third signal and the fourth signal.

14. The method of claim 13, wherein the first signal and the second signal are received before the third signal and the fourth signal, and wherein the value stored to the second memory device indicates that a first error occurred at the first memory device and the second value stored to the second memory device indicates that a second error occurred at the third memory device.

15. The method of claim 10, further comprising:
receiving subsequent second memory access commands for the second memory device while the one or more processes associated with the second memory access commands for the second memory device are interrupted;
storing the received subsequent second memory access commands in temporary storage based at least in part on receiving the subsequent second memory access commands while the one or more processes associated with the second memory access commands for the second memory device are interrupted; and
processing the received subsequent second memory access commands after resuming processing the interrupted one or more processes associated with the second memory access commands for the second memory device.

16. The method of claim 10, wherein the value stored at the second memory device indicates a voltage abnormality, a temperature abnormality, or both associated with the first memory device.

17. An apparatus, comprising:
a first memory device comprising a plurality of dynamic random access memory (DRAM) cells, wherein the first memory device is coupled with a first memory interface for communicating first memory access commands associated with the plurality of DRAM cells with a host device,
a second memory device comprising a plurality of NAND cells, wherein the second memory device is coupled with a second memory interface for communicating the second memory access commands associated with the plurality of NAND cells with the host device, and
a controller coupled with the first memory device, the second memory device, a first signal path, and a second signal path, wherein the first signal path and the second signal path are different than the first memory interface and the second memory interface, and wherein the first memory device, the second memory device, and the controller are included within a single memory system package, wherein the controller is configured to:
receive, via the first signal path, a first signal from the first memory device;
interrupt one or more second memory access commands of the second memory device based at least in part on receiving the first signal;
receive, via the second signal path and based at least in part on interrupting the one or more second memory access commands of the second memory device, a second signal from the first memory device that indicates one of a plurality of types of errors associated with the first memory device; and
store a value associated with the second signal to the second memory device based at least in part on receiving the first signal and the second signal.

18. The apparatus of claim 17, wherein the controller is configured to:
interrupt one or more second memory access operations being performed on the second memory device based at least in part on receiving the first signal from the first memory device.

19. The apparatus of claim 17, wherein the controller is configured to:
output the stored value associated with the second signal via a memory interface associated with the second memory device.

20. The apparatus of claim 17, wherein the controller is configured to:
receive an analog voltage corresponding to the first signal received by the first memory device; and
convert the analog voltage into a digital value corresponding to an error of the plurality of types of errors associated with the first memory device.

21. The apparatus of claim 20, wherein:
storing the value associated with the second signal to the second memory device comprises storing the digital value corresponding to the error associated with the first memory device.

22. The apparatus of claim 17, further comprising:
a third memory device comprising a plurality of DRAM memory cells, wherein the controller is configured to;
receive a third signal from the third memory device;
interrupt one or more processes associated with one or more second memory access commands for the second memory device based at least in part on receiving the third signal;
receive a fourth signal from the third memory device that indicates one of the plurality of types of errors associated with the third memory device; and
store a second value associated with the fourth signal at the second memory device based at least in part on receiving the third signal and the fourth signal.

23. The apparatus of claim 17, further comprising:
a capacitor coupled with a signal path coupled with the first memory device and the controller, wherein the second signal received by the controller is based at least in part on a charge stored at the capacitor.

24. The apparatus of claim 23, wherein the charge stored to the capacitor is based at least in part on a digital signal associated with the first memory device.

25. The apparatus of claim 17, wherein the value stored at the second memory device indicates a voltage abnormality, a temperature abnormality, or both associated with the first memory device.

* * * * *